United States Patent
Akaogi et al.

(10) Patent No.: US 6,208,556 B1
(45) Date of Patent: *Mar. 27, 2001

(54) ADDRESS TRANSITION DETECT TIMING ARCHITECTURE FOR A SIMULTANEOUS OPERATION FLASH MEMORY DEVICE

(75) Inventors: Takao Akaogi, Cupertino; Kazuhiro Kurihara, Sunnyvale; Tien-Min Chen, San Jose, all of CA (US)

(73) Assignees: Advanced Micro Devices, Inc., Sunnyvale, CA (US); Fujitsu Limited (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/547,556

(22) Filed: Apr. 12, 2000

Related U.S. Application Data

(63) Continuation of application No. 09/421,776, filed on Oct. 19, 1999.

(51) Int. Cl.[7] .................................................. G11C 16/04
(52) U.S. Cl. ......................................................... 365/185.11
(58) Field of Search .......................... 365/185.11, 185.21, 365/185.22, 185.33, 233.5

(56) References Cited

U.S. PATENT DOCUMENTS

| | | | |
|---|---|---|---|
| 5,263,000 | 11/1993 | Buskirk et al. | 365/226 |
| 5,291,446 | 3/1994 | Buskirk et al. | 365/189.09 |
| 5,612,921 | 3/1997 | Chang et al. | 365/226 |
| 5,708,387 | 1/1998 | Cleveland et al. | 327/536 |
| 5,822,244 | * 10/1998 | Hansen et al. | 365/185.11 |
| 5,841,696 | * 11/1998 | Chen et al. | 365/185.11 |
| 5,847,998 | 12/1998 | Buskirk | 365/185.33 |
| 5,867,430 | * 2/1999 | Chen et al. | 365/185.11 |
| 5,943,291 | * 8/1999 | Manning | 365/233.5 |
| 6,005,803 | 12/1999 | Kuo et al. | 365/185.11 |
| 6,016,270 | * 1/2000 | Thummalapally et al. | 365/185.11 |

OTHER PUBLICATIONS

Brian Dipert and Markus Levy "Designing with Flash Memory—The definitive guide to designing flash memory hardware and software for components and PCMCIA cards", Annabooks, ISBN 0-929392-17-5, Ch 3, pp. 23-44.
AMD, Technology Background brochure, "3.0 Volt-only Page Mode Flash Memory Technology."
AMD, Technology Background brochure, "3.0 Volt-only Burst Mode Flash Memory Technology."
AMD, Technology Background brochure, "1.8 Volt-only Flash Memory Technology."
AMD, Technology Background brochure, "AMD DL160 and DL320 Series Flash: New Densities, New Features."
Intel Corporation, "Common Flash Memory Interface Specification", Release 1.1, May 30, 1997.

(List continued on next page.)

*Primary Examiner*—Trong Phan
(74) *Attorney, Agent, or Firm*—Brinks Hofer Gilson & Lione

(57) ABSTRACT

An address transition signal generator for a dual bank flash memory device is disclosed. The generator includes signal transition detectors which monitor control signals of the device for transitions in their logical values. Upon detection of a signal transition, the transition detectors send a signal across equidistant signal paths to bank address transition detect signal generator circuits. This results in simultaneous generation of the address transition detect signal from each of the bank address transition detect signal generator circuits.

7 Claims, 16 Drawing Sheets

OTHER PUBLICATIONS

AMD, "Common Flash Memory Interface Publication 100—Vendor & Device ID Code Assignments", Jul. 25, 1996, vol. 96.1.

AMD "Am29DL162C/AM29DL163C 16 Megabit (2 M×8–Bit/1 M×16–Bit) CMOS 3.0 Volt–only, Simultaneous Operation Flash Memory", Publication 21533, Rev: C Amendment/+2, Jul. 14, 1999.

Intel Corporation, "1.8 Volt Intel® Dual–Plane Flash Memory 28F320D18 (×16)", Product Review Datasheet, Order No.: 290672–002, Oct. 1999.

Macronix International Co., Ltd. "MXIC Advance Information MX29VW160T/B—16MBIT [2M×8–BIT/1M× 16–BIT] Simultaneous Read/Write Single 2.5V Operation Flash Memory", P/N:PM0567, Rev. 0.8, May 17, 1999.

ATMEL Corporation, "ATMEL® 16–megabit (1M×16/2M× 8) 3–volt Only Flash Memory", Rev. 0925H—Aug. 1999.

STMicroelectronics, "M59DR032A, M59DR032B, 32 Mbit (2Mb×16, Dual Bank, Page) Low Voltage Flash Memory", preliminary data, Oct. 1999, pp. 1–38.

"AMD—Flash Introduction", obtained at the internet address http://www.amd.com/products/nvd/overview/flash_intro.html, Apr. 14, 1999.

"AMD—Simultaneous Read/Write", obtained at the internet address http://www.amd.com/products/nvd/overview/simuintro.html, Jul. 12, 1999.

"AMD News Release #9879", obtained at the internet address hhtp://www.amd.com/news/prodpr/9879.html.

"Intel® 1.8 Volt Dual–Plane 32–Mbit Flash Memory (D18)", obtained at the internet address http://www.intel.com/design/flcomp/prodbref/298131.htm, Nov. 18, 1999.

U.S. application No. 09/159,023, filed Sep. 23, 1998.

U.S. application, No. 09/159,142, filed Sep. 23, 1998.

U.S. application, No. 09/159,489, filed Sep. 23, 1998.

\* cited by examiner

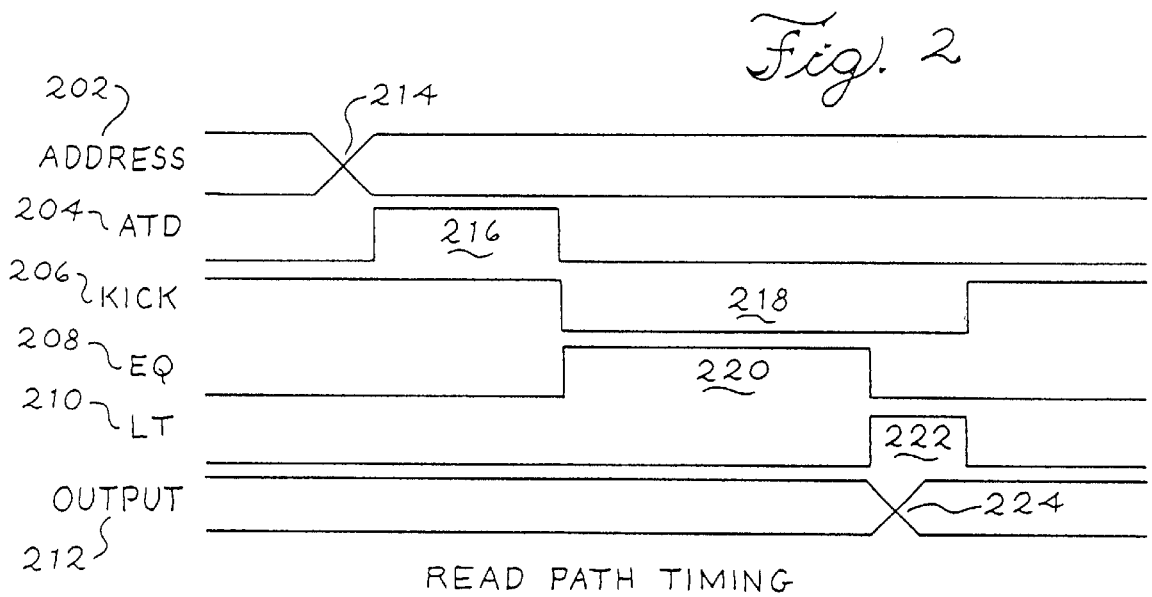
Fig. 2
READ PATH TIMING
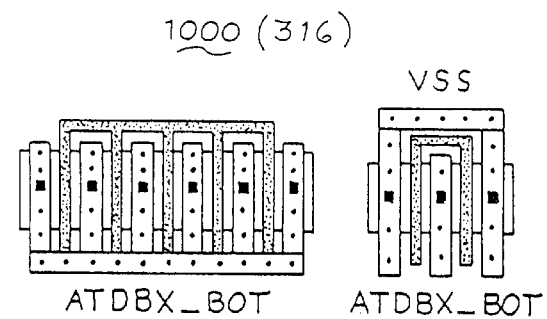
Fig. 10
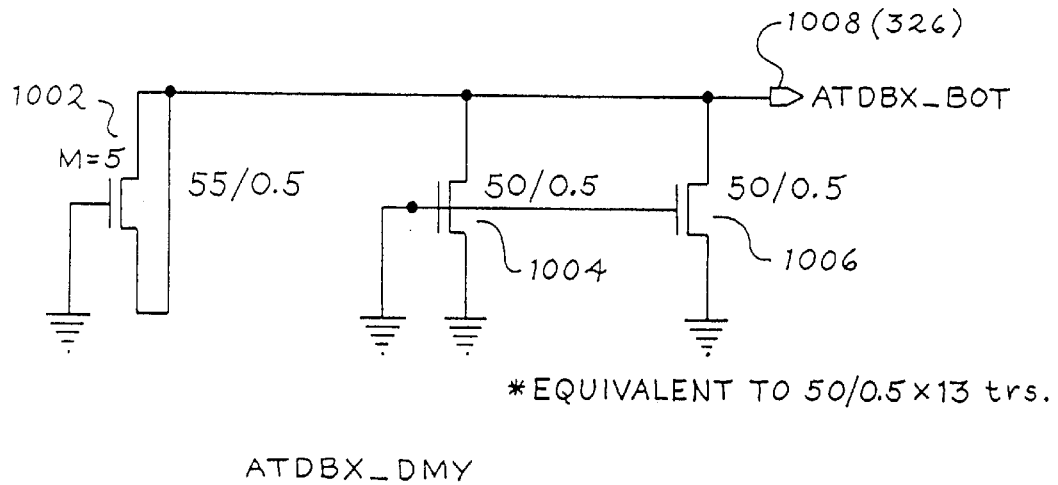
*EQUIVALENT TO 50/0.5 × 13 trs.
ATDBX_DMY

LTIME

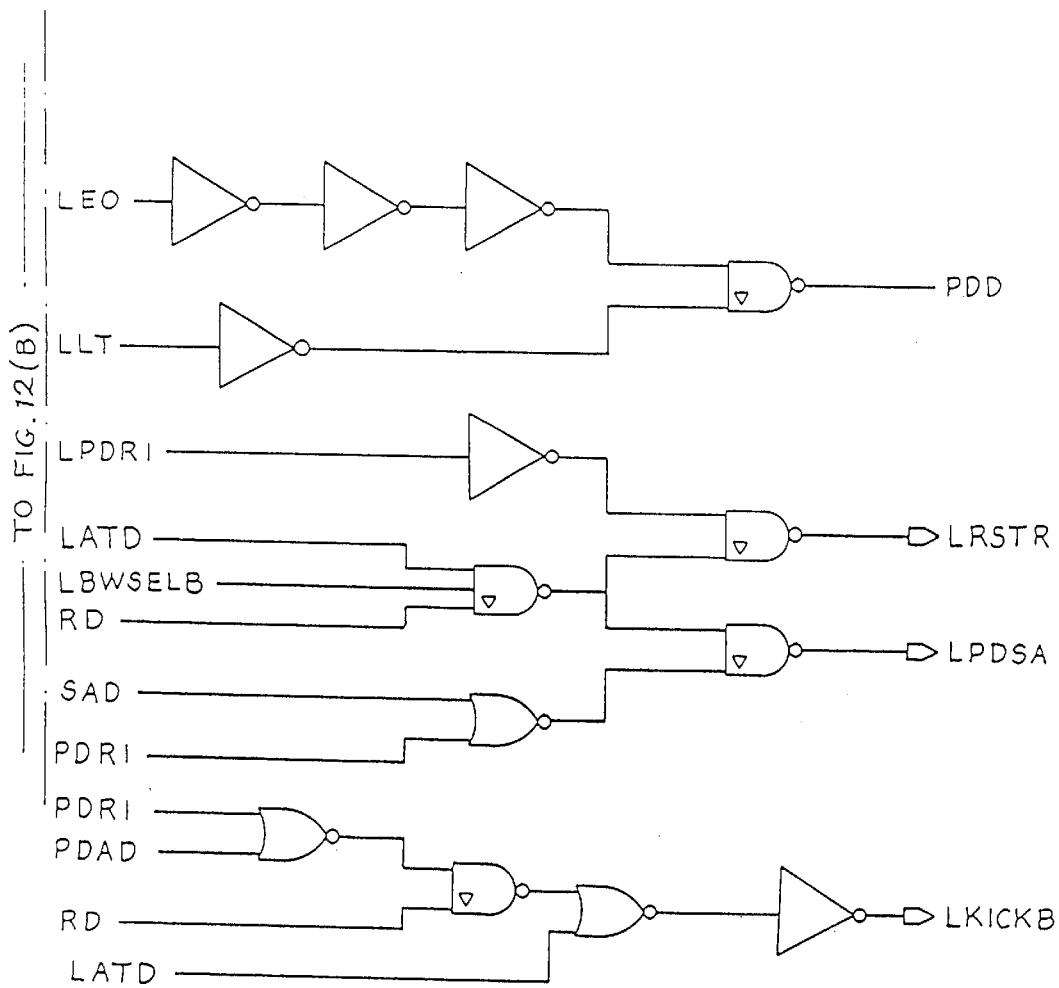
Fig. 12(C) LTIME

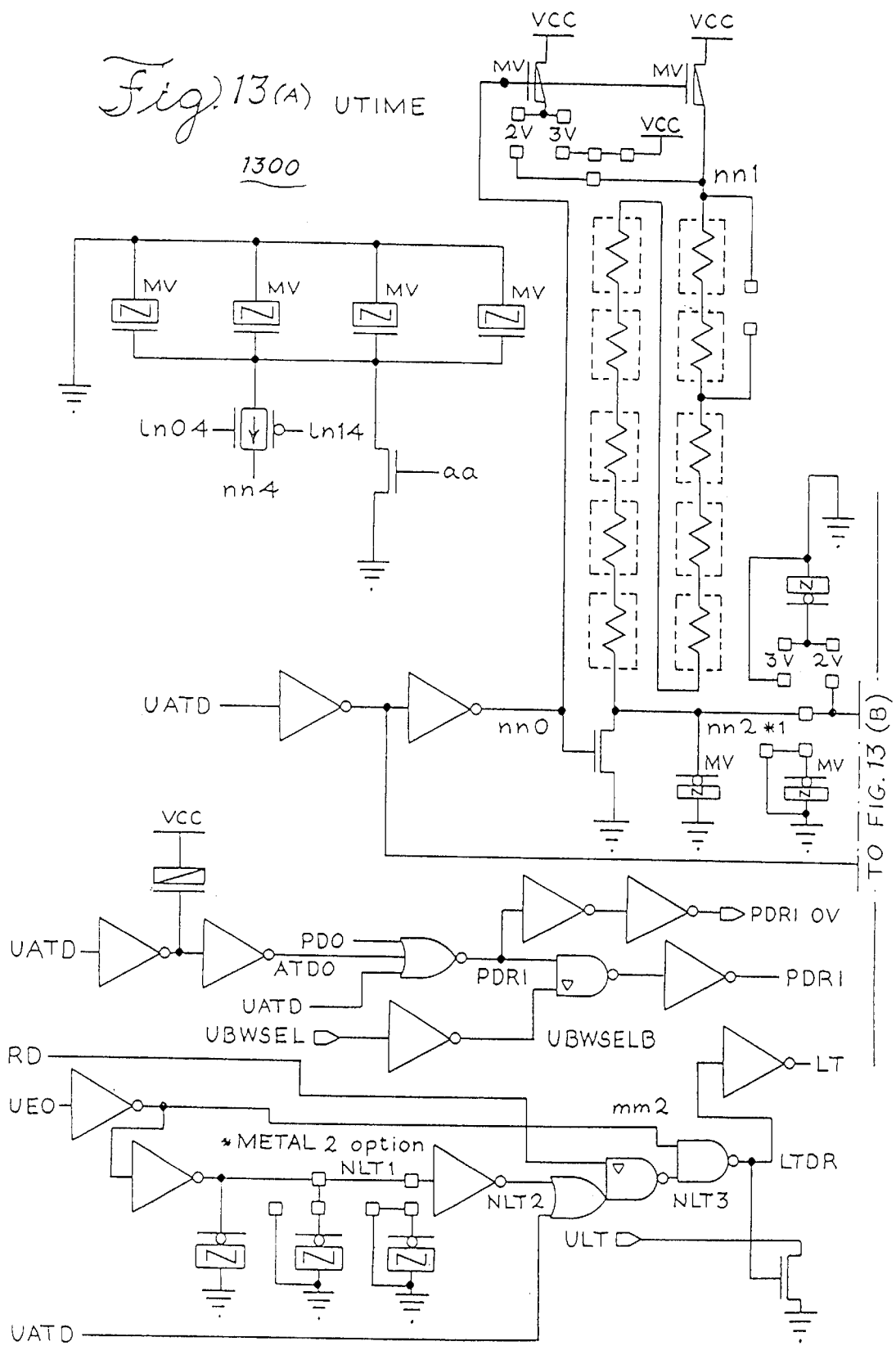
Fig. 13(A) UTIME 1300

UTIME

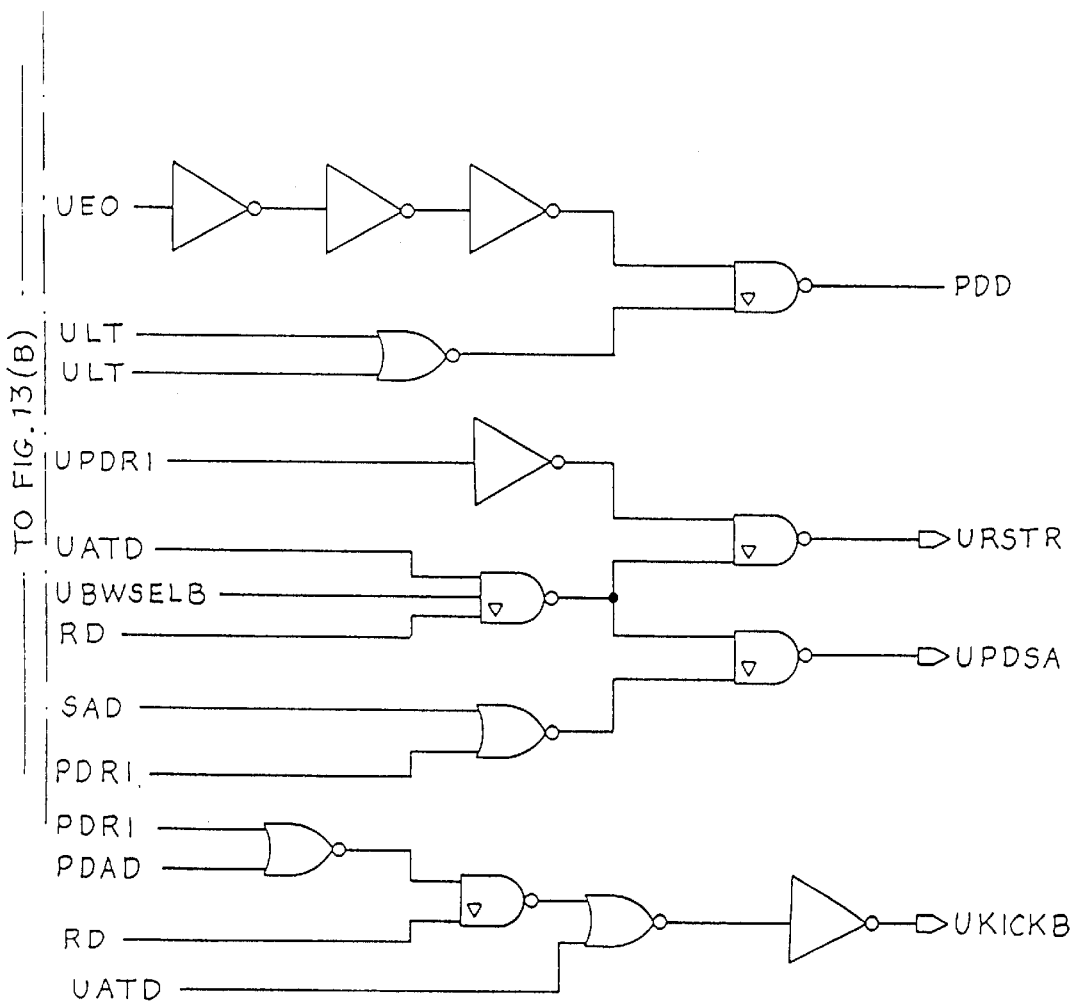
Fig. 13(c) UTIME

ADDRESS TRANSITION DETECT TIMING ARCHITECTURE FOR A SIMULTANEOUS OPERATION FLASH MEMORY DEVICE

This application is a continuation of 09/421,776, filed Oct. 19, 1999.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices are integrated-circuit based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips be removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-functional. SRAM offers high operating speeds but only maintains its contents as long as power is supplied, therefore requiring a battery or other power source. This necessitates additional hardware to maintain power to the SRAM to preserve the stored contents which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM's, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modern flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds per sector. To erase an entire chip can take up to 49 seconds depending on the number of sectors. While programming is much faster, on the order of 7 to 300 micro-seconds per byte, it is still slow compared to other memory devices. Programming an entire chip can still take up to 120 seconds (including the time to verify the data) depending on the capacity of the chip.

Typically, standard Dynamic Random Access Memory ("DRAM") offers write access times on the order of nanoseconds, a difference between flash memory of many orders of magnitude.

This complex nature of programming and erasing flash memory devices leads to a major problem in that they do not provide sufficiently fast write access which then affects read accesses. For example, conventional flash memory devices typically do not allow a processor to perform a read operation while a program or erase operation is underway in the flash memory device. In most implementations, the processor is required to periodically poll a status register of the flash memory device to detect the end of the program or erase operation before initiating a read operation to the flash memory device.

Unfortunately, as noted above, the programming and erase cycle times for typical flash memory devices are orders of magnitude greater than acceptable write access times of a conventional random access main memory using, for example, Dynamic Random Access Memory ("DRAM"). Such long latencies associated with programming or erase operations can lock up the operating system and prevent the system from functioning for unacceptably long time intervals if the flash memory is the only memory in the electronic system. Some prior flash memories allow erase suspend operations in order to address this problem. Erase suspend allows the processor to pause an erase operation so another sector can be read. However, such memories typically still impose a suspend latency interval of several microseconds before a read operation can be initiated. A typical suspend latency interval is from 0.1 to 20 microseconds.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high costs because multiple flash memory devices are implemented even though the capacity of a single flash memory device may accommodate the needs of the particular electronic device.

Another prior art system uses a flash memory in combination with an EEPROM memory. This system allows a read operation of one of the memories while writing to the other. However, the size of an EEPROM memory cell is significantly larger than that of a flash memory cell which reduces the amount of storage that can be placed on the memory chip. Further, there are significant design and manufacturing complexities involved with integrating two different memory technologies on the same chip. Therefore, a device which uses an EEPROM in combination with a flash memory will typically be more expensive both to design and manufacture.

In addition, programming and erasing a flash memory involves higher than normal voltages as compared to performing read operations. The use of these higher than normal voltages can cause problems when trying to implement the capability to simultaneously read while programming/erasing. Such problems include difficulties in distributing the high voltages required for the program and erase operations along with normal voltage for read operations and handling increased noise induced on the read sense outputs by the use of high voltages elsewhere within the device. Further, depending on the implementation, redundant logic may also be employed which introduces further complexities.

Accordingly, there is a need for an efficiently designed and manufacturable flash memory device that allows simultaneous read and write operations.

SUMMARY OF THE INVENTION

The present invention is defined by the following claims, and nothing in this section should be taken as a limitation on those claims. By way of introduction, the preferred embodiments described below relate to an address transition detector for a dual bank flash memory device. The detector includes a plurality of signal inputs each of which connects to a pulse generator. The pulse generator generates an output signal when the signal input transitions from 0 to 1 or 1 to 0. The detector further includes address transition detect ("ATD") signal generators operative to generate an ATD signal for each bank. Each signal generator includes a circuit which inverts the input and sends it out to itself and the other signal generator over equidistant signal paths. The equidistant signal paths cause the input signal to reach the signal generators simultaneously which then causes the signal generators to generate their respective ATD signal simultaneously. In this way, the bank read access times are optimized by the synchronized timing between the two memory banks.

BRIEF DESCRIPTION OF THE DRAWINGS

FIG. 2 depicts a preferred read path timing for a the flash memory chip of FIG. 1.

FIG. 10 depicts a schematic diagram of an ATDBX_DMY circuit for use with address transition detect signal generator of FIG. 3.

DETAILED DESCRIPTION OF THE PRESENTLY PREFERRED EMBODIMENTS

Herein, the phrase "coupled with" is defined to mean directly connected to or indirectly connected with through one or more intermediate components. Referring now to the Figures and in particular, FIG. 1, there is schematically shown a flash memory device 100 according to the present invention that provides for reading while simultaneously undergoing a program or erase operation. The memory device 100 according to the present invention may include one or more components of the memory devices disclosed in U.S. Pat. No. 5,867,430 entitled "BANK ARCHITECTURE FOR A NON-VOLATILE MEMORY ENABLING SIMULTANEOUS READING AND WRITING," to Chen et al and U.S. Pat. No. 5,847,998 entitled "NON-VOLATILE MEMORY ARRAY THAT ENABLES SIMULTANEOUS READ AND WRITE OPERATIONS," to Van Buskirk, both of which are herein incorporated by reference and further describe the implementation and operation of a device of this type. The memory device 100 may also include one or more components of such exemplary flash memory devices capable of simultaneous read and write operation as the Am29DL162C and Am29DL163C 16 megabit ("Mb") flash memory chips and the Am29DL322C and Am29DL323C 32 Mb flash memory chips manufactured by Advanced Micro Devices, Inc. located in Sunnyvale, California. For more detail regarding these exemplary flash memory chips, refer to "Am29DL322C/Am29L323C 32 Megabit (4M×8-Bit/2 M×16-Bit) CMOS 3.0 Volt-only, Simultaneous Operation Flash Memory" Datasheet and "Am29DL162C/Am29L163C 16 Megabit (2 M×8-Bit/1 M×16-Bit) CMOS 3.0 Volt-only, Simultaneous Operation Flash Memory-"Datasheet. While the exemplary devices disclosed above have capacities of 16 or 32 Mb, it will be appreciated that the embodiments disclosed herein are equally applicable to devices with higher bit densities such as 64 or 128 Mb devices.

In a typical embedded application of the above exemplary simultaneous operation capable flash memory 100, the available data storage space can be structured to store data and boot code in one bank and control code in another bank. The control code, which can contain command sequences which tell one bank, for example, bank 196, to program/erase data sectors, can reside as executable code in the alternate bank, for example bank 194. While the first bank is being programmed/erased, the system can continue to execute code from the alternate bank to manage other system operations. Similarly, depending on the system implementation, the CPU can also execute code from the first bank while the alternate bank undergoes a program/erase. There is no bank switching latency and no need to suspend the program/erase operation to perform the read. This minimizes the CPU's read/write cycle time, maximizes data throughput and reduces overall system cost by eliminating the need for additional hardware. It will be appreciated that while the exemplary devices have two banks of memory cells, devices with more than two banks are contemplated.

Figure 1:
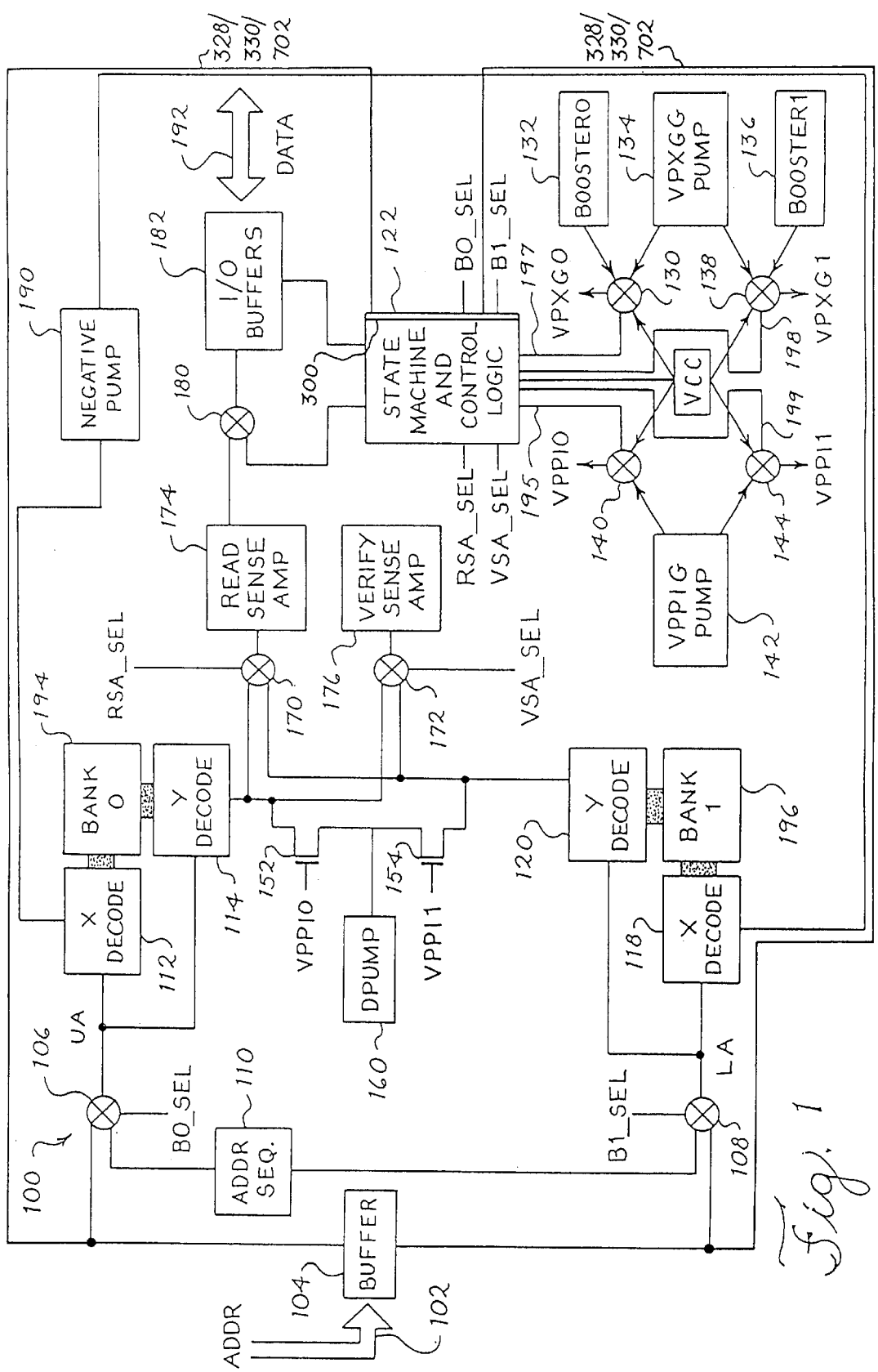
FIG. 1 depicts a block diagram of a flash memory chip according to the present invention that is capable of simultaneous reading and writing.

Again referring to FIG. 1, the memory device 100, according to an embodiment of the present invention with a capacity of 32 Mb and operating in word addressable mode, includes a 21 bit address input 102, a 16 bit data input/output ("DATA") 192, power inputs (not shown in FIG. 1) and control inputs (not shown in FIG. 1). It will be appreciated that the memory device 100 with a capacity of 16 Mb only requires 20 address bits and when operating in byte mode, the 32 Mb device 100 requires 22 address bits and the 16 Mb requires 21 address bits. The control inputs include Chip Enable, Output Enable, and Write Enable. The Chip Enable signal activates the chip's control logic and input/output buffers. When Chip Enable is not asserted, the memory device operates in standby mode. Output Enable is used to gate the outputs of the device through I/O buffers during read cycles. Write Enable is used to enable the write functions of the memory device. In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with higher memory densities and alternate interface implementations with their accompanying alternate address and control input configurations.

The memory device 100 further includes address buffer 104, address multiplexers 106 and 108, address sequencer 110, X logical address decoders 112 and 118, Y logical address decoders 114 and 120, memory array Banks 0 and 1 denoted as 194 and 196 respectively, Dpump 160, data multiplexers 170 and 172, read sense amplifiers 174, verify sense amplifiers 176, negative pump 190, output multiplexer 180, state machine and control logic 122, input/output buffers 182, VPPIG Pump 142, booster 0 denoted as 132, VPXGG Pump 134, booster 1 denoted as 136 and power multiplexers 130, 138, 140 and 144. The address input 102 is received by the address buffer 104, which sends the address to the address multiplexer 106 for bank 194 and the address multiplexer 108 for bank 196. The address sequencer 110 is controlled by the state machine and control logic 122. In one embodiment, the address sequencer 110 is part of the state machine and control logic 122. The output of the address sequencer 110 is an address which is sent to both multiplexer 106 and multiplexer 108. The address sequencer 110 is used to generate sequential addresses during an erase sequence. The output of the multiplexer 106, upper address UA, is communicated to the X address decoder 112 and the Y address decoder 114. The output of the multiplexer 108, lower address LA, is sent to the X address decoder 118 and the Y address decoder 120. The multiplexer 106 chooses between the address from the buffer 104 and the address from the address sequencer 110 in response to a control signal BO_SEL. The multiplexer 108 chooses between the address from the address buffer 104 and the address from address sequencer 110 based on a control signal B1_SEL. The selection signals B0_SEL and B1_SEL are generated by the state machine and control logic 122.

Bank 194 and bank 196 are arrays (or sets) of flash memory cells (operation of these individual flash memory cells is discussed in more detail below). The banks 194, 196 are organized by words and then by sectors and can either be byte or word addressable. It will be appreciated by those skilled in the art that other types of non-volatile memory are also within the scope of the present invention. The address decode logic for bank 194 includes the X address decoder 112 and the Y address decoder 114. The X address decoder 112 includes a word line decoder and sector decoder. The word line decoder receives address bits UA[6:14] and the sector decoder receives address bits UA[15:20]. The Y address decoder 114 includes a bit line decoder and Y bit line gating. The bit line decoder receives address bits UA[0:5].

The address decode logic for bank 196 includes the X address decoder 118 and the Y address decoder 120. The X address decoder 118 includes a word line decoder and a sector decoder. The word decoder receives address bits LA[6:14] and the sector decoder receives address bits LA[15:20]. The Y address decoder 120 includes a bit line decoder and Y bit line gating. The bit line decoder receives address bits LA[0:5]. In one embodiment, the address buffer 104 includes a latch to store the address being decoded. In another embodiment, the latch can be part of the decoders 112, 114, 118, 120.

FIG. 1 further shows a multiplexer 130 with three inputs: booster zero 132, VPXGG pump 134 and Vcc. The VPXGG pump 134 is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump 134 can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference. Booster 132 is used to boost the word line during reads. The multiplexer 130 receives a selection signal 197 from state machine and control logic 122 and chooses one of its three inputs to send to the word lines of bank 194 via the X address decoder 112. The output of the multiplexer 130 is labeled as VPXG0. FIG. 1 is drawn to show the three inputs 132, 134 and Vcc connected to a multiplexer in order to simplify the disclosure. A more detailed description of one exemplary implementation can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

FIG. 1 also includes another multiplexer 138 having three inputs: booster one denoted as 136, VPXGG pump 134 and Vcc. Booster 136 is similar to booster 132. The multiplexer 138 operates in a similar fashion to multiplexer 130, and receives its selection signal 198 from the state machine and control logic 122. The output of multiplexer 138 is VPXG1 which is sent to the word lines of bank 196 via the X address decoder 118. The purpose of the multiplexers 130 and 138 is to switch between the three power lines depending on the operation being performed on the particular bank of memory cells.

The VPPIG pump 142 is a high voltage pump used to pass high voltage to the drain of the memory cells. The output of the VPPIG pump 142 is sent to multiplexer 140 and multiplexer 144. Both multiplexers also have Vcc as an input. Multiplexers 140 and 144 switch between inputs based on signals 195 and 199 from the state machine and control logic 122. The output of multiplexer 140 is VPPI0 and the output of multiplexer 144 is VPPI1. During a normal read operation, VPPI1 and VPPI0 are connected to Vcc. VPPI0 is connected to the gate of an N-channel transistor 152. VPPI1 is connected to the gate of an N-channel transistor 154. The source of transistor 152 is connected to Y address decoder 114, multiplexer 170 and multiplexer 172. The drain of transistor 152 is connected to the Dpump 160 and the drain of transistor 154. The Dpump 160 is a drain power supply. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference. The source of transistor 154 is connected to multiplexer 170 and multiplexer 172. The source of transistor 154 is also connected to Y address decoder 120 for purposes of accessing the bit lines in bank 196. The connections to multiplexers 170 and 172 provide a path for reading data from bank 194 and bank 196. Multiplexer 170 uses the signal RSA_SEL from the state machine and control logic 122 to selectively choose one of the two input signals to communicate to the read sense amplifiers 174. Multiplexer 172 uses the selection signal VSA_SEL from the state machine and control logic 122 in order to selectively communicate one of its two input signals to the verify sense amplifiers 176. Thus, the two transistors (152 and 154) and the two multiplexers (170 and 172), are used to selectively pass voltages to the drains of selected cells in bank 194 or bank 196 and to selectively read data from either bank 194 or bank 196. For the sake of clarity, the implementation of multiplexers 170 and 172 is illustrative only. Some of the implementation details are not shown in FIG. 1. In the memory device 100, there are actually two sets of sense amplifiers, one set for each bank 194, 196. There are also two sets of verify sense amplifiers. Data from the banks is multiplexed from each bank 194 or 196 to either its read sense amplifier or its verify sense amplifier. When a bank 194 or 196 is using its read sense amplifier, its verify sense amplifier is turned off and vice versa. It will be appreciated that there are many ways to multiplex multiple data sources among multiple destinations.

Data from either bank 194 or bank 196 can be communicated to either the read sense amplifiers 174 or the verify sense amplifiers 176. Both sense amplifiers are in communication with the state machine and control logic 122. While data from bank 194 is communicated to the read sense amplifiers 174, data from bank 196 can be communicated to the verify sense amplifiers 176. While data from bank 194 is communicated to the verify sense amplifiers 176, data from bank 196 can be communicated to the read sense amplifiers 174. The output of the verify sense amplifiers 176 is sent to the state machine and control logic 122, which is used to verify that a particular byte has been programmed or erased. Note that in the memory device 100, the preferred implementation of the read sense amplifiers 174 provides two sets of sense amplifiers, one for each bank 194, 196. Only the sense amplifiers for the bank 194 or 196 undergoing a read operation are active during the read operation. The verify sense amplifiers 176 of the memory device 100 also have two sets of verify amplifiers, one for each bank.

Data from the read sense amplifiers 174 is sent to multiplexer 180. A second input of the multiplexer 180 includes device 100 status information from the state machine and control logic 122 such as whether or not a program or erase is in progress. The selection signal for multiplexer 180 is provided by the state machine and control logic 122.

I/O buffers 182 are used to pass data out and receive data into memory device 100. While a read is being performed on one of the banks, multiplexer 180 will communicate output data from read sense amplifiers 174 to I/O buffers 182. During an erase or program sequence, multiplexer 180 will communicate status information to I/O buffers 182 so that an outside processor can poll the memory device 100 for the status in regard to the erase or program.

The memory device 100 also includes a negative pump 190 that is used to generate a relatively high negative voltage to the control gates of selected memory cells via the word lines of either bank 194 or bank 196, as selected by the state machine and control logic 122. The negative pump 190 is in communication with the X address decoders 112 and 118. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

The state machine and control logic 122 provides the control for read, program and erase operations. Many of the selection lines used to select between bank 194 and bank 196 are controlled by the state machine and control logic 122. Alternatively, the output from the X and Y address decoders 112, 114, 118, 120 can be used to select between banks of memory cells.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state machine and control logic 122, which uses a command register to manage the commencement of either sequence. The erase and programming operations are only accessed via the command register which controls an internal state machine that manages device operations. Commands are written to the command register via the data inputs 192 to the memory device 100.

While one bank is being programmed, the other bank can be accessed for a read operation. For example, during a program of a byte in bank 196, the state machine and control logic 122 would cause multiplexer 108 to select the address from buffer 104 for communication to decoders 118 and 120. Further, the state machine and control logic 122 would store the data byte to be programmed from the I/O buffers 182 for verification when the programming completes. The output of bank 196 would be sent to the verify sense amplifiers 176 via multiplexer 172 for comparison with the stored input data. During a simultaneously initiated read operation to bank 194, the state machine and control logic 122, after storing away the data to be programmed, instructs multiplexer 106 to select the address from the buffer 104 for communication to the X and Y address decoders 112 and 114. The output of bank 194 would be sent to the read sense amplifiers 174 via multiplexer 170. The output of the read sense amplifiers 174 would be sent, via multiplexer 180, to the I/O buffers 182 and then to the data bus 192.

Similarly, during an erase of a sector in bank 194, the state machine and control logic 122 would cause multiplexer 106 to select the addresses from the address sequencer 110. The address sequencer 110 would be used to cycle through all the bytes in a particular sector to make sure that each byte is preprogrammed. The sector is subsequently bulk erased. After erasure, the address sequencer 110 would be used to generate addresses to verify each byte of this erased sector. While bank 194 is being erased and multiplexer 106 is selecting an address from the address sequencer 110, a read operation can be carried out in bank 196 by using multiplexer 108 to select the address from the buffer 104 rather than an address from address sequencer 110. During the verify operation of the erase method for bank 194, the state machine and control logic 122 would be verifying the data using the verify sense amplifiers 176, while read data from bank 196 would be communicated to the read sense amplifiers 174. Thus, each bank has two input address paths and two output data paths that can be multiplexed so that either bank can be read from while the other bank is simultaneously being written to.

In the memory device 100, each memory cell, within the banks 194 or 196, includes a nor-type floating gate transistor. It will be appreciated by those skilled in the art, however, that there are many ways to implement a flash memory cell and that the configurations and operating characteristics may vary. It will further be appreciated that the embodiments disclosed herein are generally applicable and not limited to one particular implementation of a flash memory cell. The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump 190. An exemplary high positive voltage applied to the source during an erase is approximately 5 volts and an exemplary high negative voltage applied to the control gate/word line by the negative pump 190 is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply 142 and the control gate/word line is connected to a high voltage provided by the VPXGG pump positive power supply 134. An exemplary high voltage applied to the drain by the VPPIG 142 is approximately 5 Volts while an exemplary high voltage applied to the control gate by the VPXGG 134 pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell require higher than normal voltages, reading from the cell only requires the availability of the normal supply voltage. To read from the memory cell, the source is connected to ground (also referred to as Vss) and the control gate/word line are connected to the booster power supplies 132, 136. Prior to selecting the transistors for a read, the bit lines are charged up via the Dpump 160. When the cells turn on (if erased), they will connect their respective bit line to ground, grounding out the bit line. The current value of the memory cell is then sensed from the drain/bit line connection. There is a booster power supply 132 for bank 194 and a booster power supply 136 for bank 196. The booster power supplies 132, 136 are used to boost the word lines of bank 194 or bank 196 during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that a transistor that is on, grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state machine and control logic 122. This logic 122 controls the multiplexers 130, 138, 140, 144 that place the proper voltages from the various power supplies 132, 134, 136, 142 and Vcc on the memory cell inputs depending on the desired function.

While the total capacity of the simultaneous read and write capable flash memory device 100 is 16 or 32 MB or higher, how that capacity is distributed among the available banks is variable. Users of simultaneous read and write capable flash memory may need different bank partition sizes depending on their applications. To meet the varying needs of users, the flash memory device 100 preferably implements a sliding bank architecture. This architecture allows the simplified design and manufacture of simultaneous flash memory devices with varied bank partition sizes. To alter the bank sizes, only a single metal layer of the chip needs to be altered. For a more detailed discussion of the sliding bank architecture, refer to co-pending and commonly assigned U.S. patent application Ser. No. 09/159,142, "SIMULTANEOUS OPERATION FLASH MEMORY DEVICE WITH A FLEXIBLE BANK PARTITION ARCHITECTURE", filed Sep. 23, 1998, U.S. patent application Ser. No. 09/159,029, "METHOD OF MAKING FLEXIBLY PARTITIONED METAL LINE SEGMENTS FOR A SIMULTANEOUS OPERATION FLASH MEMORY WITH A FLEXIBLE BANK PARTITION ARCHITECTURE", filed Sep. 23, 1998 and U.S. patent application Ser. No. 09/159,489, "BANK SELECTOR CIRCUIT FOR A SIMULTANEOUS OPERATION FLASH MEMORY DEVICE WITH A FLEXIBLE BANK PARTITION ARCHITECTURE", filed Sep. 23, 1998, the entire contents of each of which are incorporated herein by reference. The sliding bank architecture enables the memory device 100 to be produced in many different configurations with only a single mask change in one of the final steps of production. In the case where the flash memory device 100 has a capacity of 32 megabits (Mb), partitions where bank 194 has a capacity 4 or 8 Mb and bank 196 has a capacity of 28 or 24 Mb respectively, can be used. In the case where the flash memory device 100 has a capacity of 16 Mb, partitions where bank 194 has a capacity of 2 or 4 Mb and bank 196 has a capacity of 14 or 12 Mb respectively, can be used. This has the advantages that many different configurations of the flash memory device 100 can share much of the same basic design, process and manufacturing expense.

In the flash memory device 100, implementation of simultaneous operation is largely achieved by the dual bank architecture of the chip as described above. While this architecture permits simultaneous reading and writing, the dual bank architecture adds complexities of its own to the design of the memory device 100. In particular, the implementation of two separate and independently accessible memory arrays requires additional logic which would ordinarily not be required on a device with a single memory array. For example, two sets of address decoders 112, 114 and 118, 120 are used, one set for each bank 194, 196, to decode addresses to both banks. While the dual bank architecture is implemented using largely separate logic for each bank 194, 196, it will be appreciated that the division of logic, between that which is shared between the banks 194, 196 and that which is bank specific, is implementation dependent and may change.

This extra logic further places burdens on the routing of signal paths among the various circuits which make up the device 100. Device 100 input signals, as well as internal signals, which only had to interconnect the logic for a single bank, must now interconnect two banks of memory cells. This often requires sending a particular signal to two destinations instead of just one. For example, the address inputs 102 to the device must now be routed to each bank 194, 196 and switched depending on which bank is undergoing a read or write operation. This is true for many of the control signal used on the device 100 as well. With the increased number, increased connections and often, increased length of signal paths, signal timing becomes an issue.

In addition, the sliding bank architecture of the memory device 100, also affects signal timing. The sliding bank architecture allows non-uniform partitioning of the device's 100 total memory capacity among the available banks. Signals which have to connect to both banks 194, 196 may be affected by the fact that the banks 194, 196 are of different sizes and therefore have a different number of devices or loads which these signals must drive.

In one embodiment of the present invention, an address transition detector is provided. Referring now to FIG. 2, there is shown a timing diagram for the signals associated with a read operation in the memory device 100. The diagram shows the address bus signals ("address") 202 (these come from the address inputs 102), the address transition detect ("ATD") signal 204, the Kick signal 206, the equalization ("EQ") signal 208, the latch ("LT") signal 210 and the data output bus ("output") 212 (which connects to the chip outputs 192). The address bus signals 202 comes from some other device which is connected to the address inputs 102 of the flash memory device 100 such as a microprocessor or microcontroller. When the address bus signals 202 change at a transition, this transition 214 initiates the read timing sequence. As will be discussed below, it is the transition or change in particular input signals which preferably triggers certain events, such as the read operation sequence, on the flash memory device 100. It will be appreciated that such interface implementation details may vary from device to device and all such implementations are contemplated.

As used herein, the phrase "high logic level" is used to indicate a logical 1 and the phrase "low logic level" is used to indicate a logic level of 0. It will be understood that the signals underlying these representations are actually represented by voltage values. A signal is said to be "asserted" when it has a value which is significant to the logic it is driving. Some signals are asserted when they are at a low logic level (also referred to as "active low") and some signals are asserted when they are at a high logic level (also referred to as "active high"). It will be appreciated that all forms of digital logic representation are contemplated including mixed logic. It will further be appreciated that the underlying voltages of the logic signals may also vary, with typical values being 2 or 3 Volts representing a logic 1 and 0 Volts representing logic 0.

Once a transition 214 is detected in the address 202, an address transition detect ("ATD") pulse 216 is generated. This is discussed below in more detail. The ATD pulse 216 is then used to control the rest of the read path timing. In response to the ATD pulse 216, the Kick signal 206 is generated to boost the word lines of the memory arrays for a read. This is shown as an active low pulse 218. Further, in response to the ATD pulse 216, the EQ signal 208 rises to a high logic level 220 to equalize the differential sense amps in the read amplifiers 174 while the array data is being sensed. Once the data has been sensed from the array, the LT signal 210 generates a pulse 222 to trigger output latches in the read sense amplifiers to latch the read data for the output buffers 182. This causes the output 212 of the chip to change 224 to output the read data outside the device 100 over the outputs 192.

The duration of the ATD pulse 216 controls the access time for the read operation. The access time is the elapsed time from the moment an address is presented on the address inputs 102 to the time the read data appears on the outputs 192. Upon detection of an address transition 214, the ATD signal 204 goes from a low logic level to a high logic level. The ATD signal 204 then remains high for a specified duration, after which it returns to a low logic level. Upon this transition from a high logic level to a low logic level, the Kick signal 206 and the EQ signal 208 are triggered which initiates the read operation. Therefore, both initiation time and the duration of the ATD signal 204 are factors in the overall access time for the read operation. The read access time is the total time elapsed from the moment an address is presented on the address inputs 102 to the moment the valid data is presented on the chip outputs 192.

In the flash memory device 100, other signals can also trigger an ATD signal 204 pulse and thereby commence the read operation sequence. For example, when the device is in the data polling mode, where an embedded erase or program operation is underway, the user of the device 100 can poll the device 100 to find out the status of the embedded operation. This status is placed on the data outputs of the device 100. This is treated similar to a read operation and requires an ATD pulse to initiate. An ATD pulse is also generated upon powering on the device 100, when the Chip Enable input 103 of the device is asserted low or when the device 100 is switched from word mode to byte mode or vice versa. It will be appreciated that the read operation sequence can be used by many different functions of the device 100 which need to produce data on the device outputs 192, all of which may require an ATD signal 204 pulse to initiate a read operation sequence.

It is preferred that the ATD signal 204 pulse width be the same for both bank 194 and bank 196 of the memory array so that both banks 194, 196 have identical access times. This simplifies the timing of the circuitry on the device 100 which is shared by both banks. Unfortunately, the sliding bank architecture along with the varying bank partition sizes introduces uneven parasitic loading (which includes resistance and capacitance of the ATD signal paths) on the ATD signal 204. The different parasitic loading will cause the pulse width of the ATD signal 204 for the two banks 194, 196 to be different and therefore affect the read access times.

Figure 3:
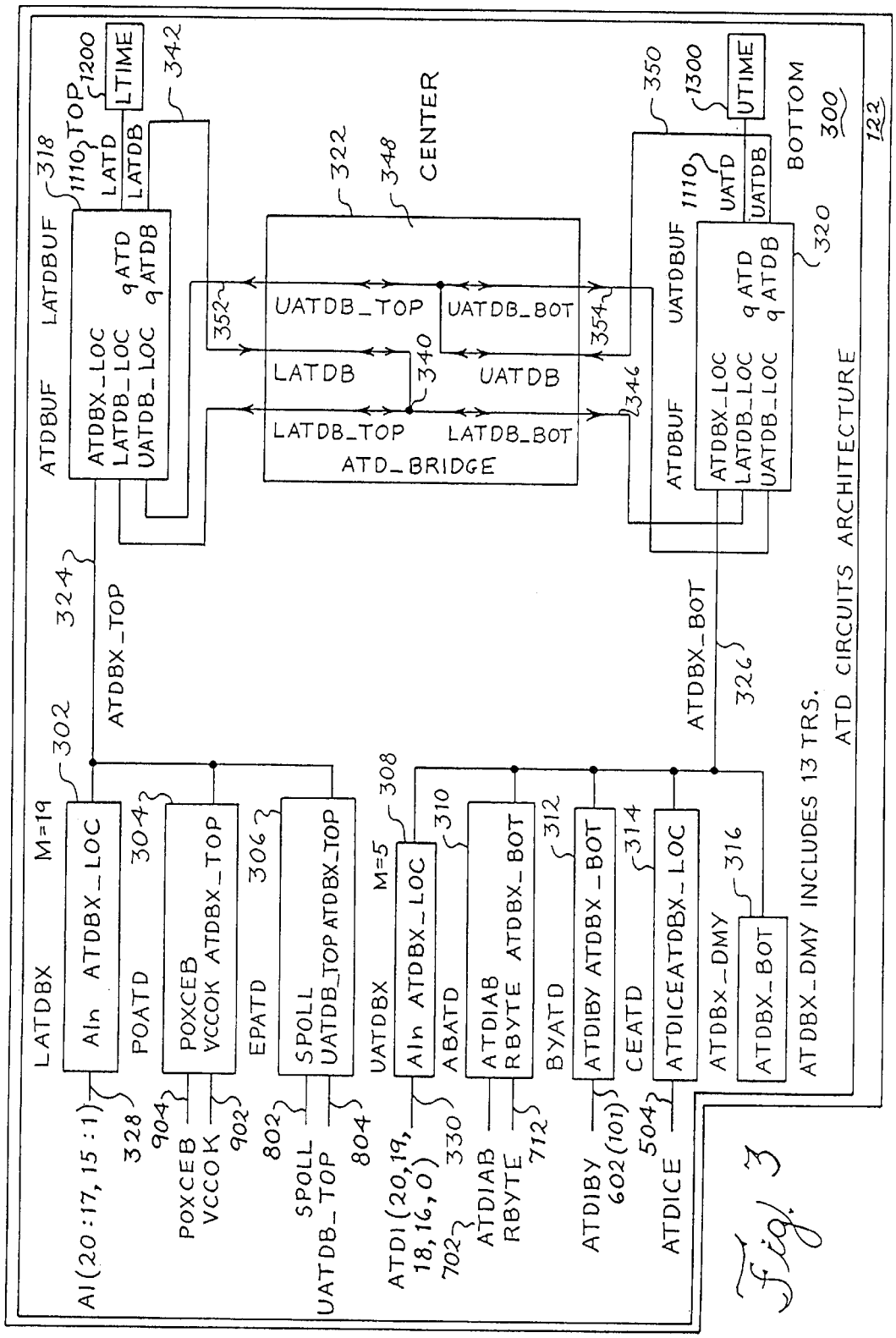
FIG. 3 depicts a schematic diagram of an address transition detect signal generator for use with the flash memory chip of FIG. 1.
Figure 11:
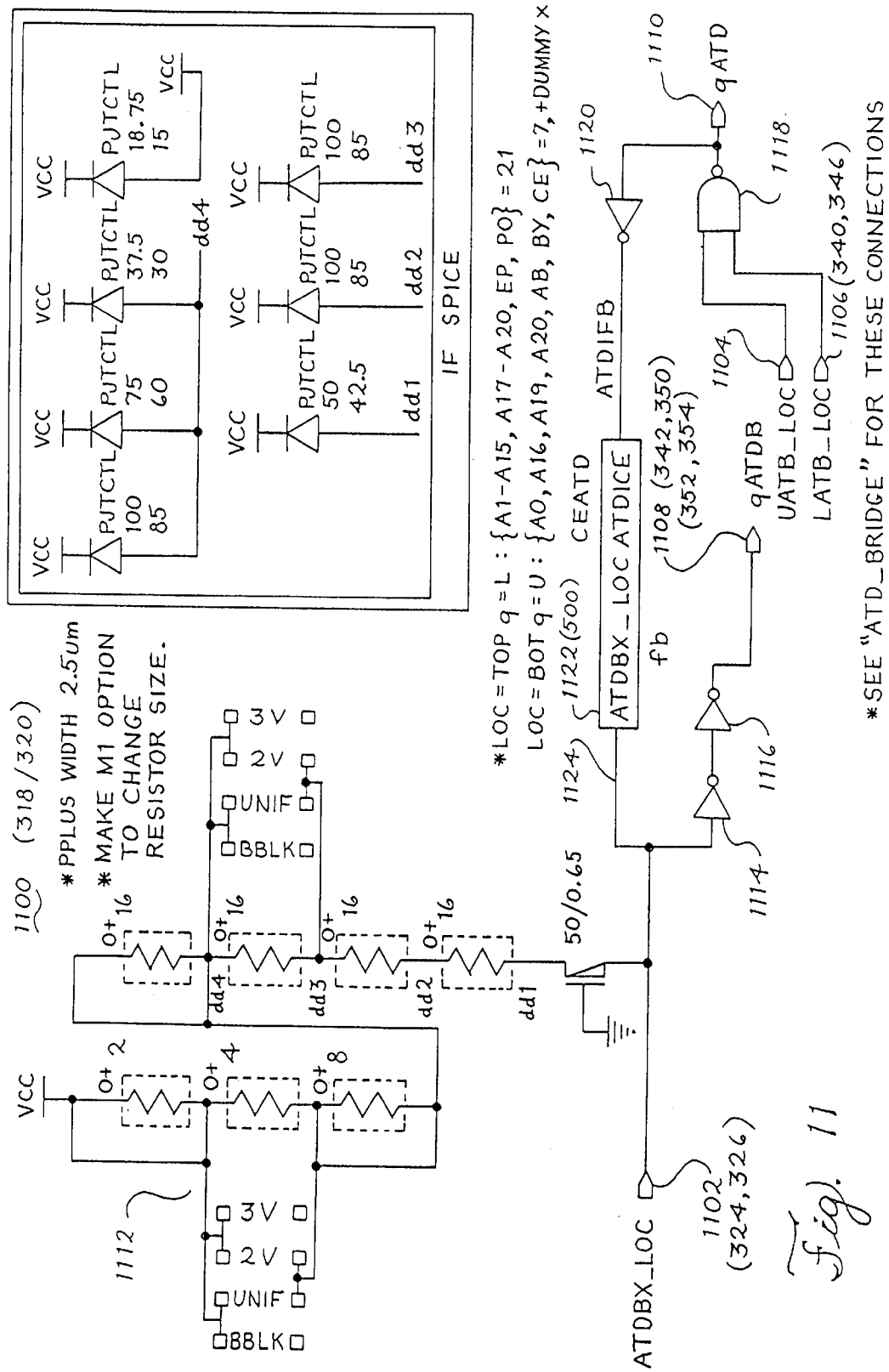
FIG. 11 depicts a schematic diagram of an ATDBUF circuit for use with address transition detect signal generator of FIG. 3.

Referring to FIG. 3, there is shown a schematic diagram of a preferred Address Transition Detect ("ATD") Signal generator circuit 300 with compensation for the unequal parasitic loading between the two memory banks 194, 196. The circuit 300 includes a lower ATD buffer 318 (labeled "LATDBUF"), an upper ATD buffer 320 (labeled "UATDBUF") and a bridge circuit 322 (labeled "ATD_BRIDGE"). Note that the LATDBUF 318 and the UATD-BUF 320 utilize the same circuit design which is depicted in FIG. 11 and labeled "ATDBUF". The circuit 300 further includes a lower address input transition pulse generator 302 (labeled "LATDBX"), a power input signal transition pulse generator 304 (labeled "POATD"), and a data polling read access signal transition pulse generator 306 (labeled "EPATD"). The outputs of these pulse generators 302, 304 306 are all connected together (in a wired-or configuration) and connected to an input of the lower ATD buffer 318 via a signal path 324 (labeled "ATDBX_top").

Figure 4:
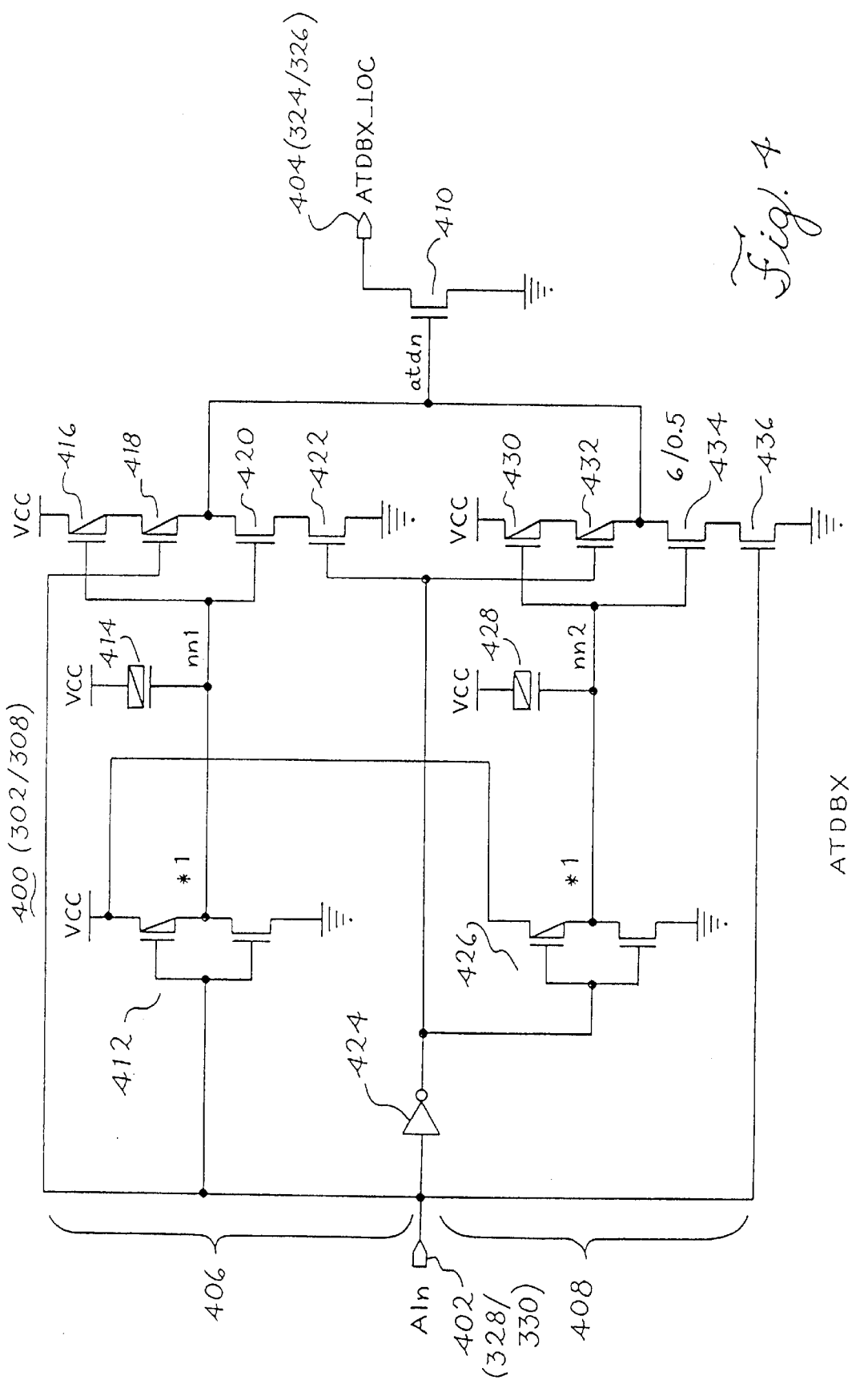
FIG. 4 depicts a schematic diagram of an ATBX circuit for use with the address transition detect signal generator of FIG. 3.

In addition, the circuit 300 includes an upper address input transition pulse generator 308 (labeled "UATDBX"), a least significant bit ("LSB") address input transition pulse generator 310 (labeled "ABATD"), a byte input transition pulse generator 312 (labeled "BYATD"), a chip enable input 103 transition pulse generator 314 (labeled "CEATD") and a pulse signal loading equalization circuit 316 (labeled "ATDBX_DMY"). The outputs of these pulse generators 308, 310, 312, 314, 316 are all connected together (in a wired-or configuration) and connected to an input of the upper ATD buffer 320 via a signal path 326 (labeled "ATDBX_bot"). Note that the lower and upper address input transition pulse generators, LATDBX 302 and UATDBX 308 utilize the same circuit design which is depicted in FIG. 4 and labeled "ATDBX". The LATDBX 302 includes inputs 328 for 19 address bits, 20:17 and 15:1, therefore there are 19 ATDBX circuits used, one for each input and all have their outputs connected together and to the ATDBX_top signal path 324. The UATDBX 308 includes inputs 330 for 5 address bits, 20:18, 16 & 0, therefore there are 5 ATDBX circuits used and all have their outputs connected together and to the ATDBX_bot signal path 326.

Referring now to FIG. 4, there is shown ATDBX circuit 400 for use in the LATDBX 302 and the UATDBX 308. This circuit 400 includes an input 402 (labeled "AIn") which is used to connect to the one of the inputs 328 or 330 of the LATDBX 302 or the UATDBX 308. The LATDBX 302 has inputs 328 for address bits 20:17 and 15:1 (19 total inputs), the UATDBX 308 has inputs 330 for address bits 20:18, 16 and 0 (5 total inputs) therefore this circuit 400 is used 24 times, once for each input. The ATDBX circuit 400 further includes an output 404 (labeled "ATDBX_loc") which connects with either the ATDBX_top signal path 324 or the ATDBX_bot signal path 326. This circuit is designed to pull output 404 to a low logic level for pre-set duration of time when a transition is detected on the input 402 and then return the output 404 to float state to be pulled up to a high logic level by the LATDBUF 318 or the UATDBUF 320 (discussed in more detail below). A transition is defined as the input signal changing from a high logic level (1) to a low logic level (0) or from a low logic level (0) to a high logic level (1).

The ATDBX circuit 400 includes a high to low transition circuit 406, a low to high transition circuit 408 and a pull down transistor 410. Pull down transistor 410 is preferably an n-channel transistor. When either transition circuit 406, 408 detects a signal transition on the input 402 transistor 410 will be turned on which will ground ATDBX_loc, pulling it down to a low logic level. The gate input to the pull down transistor 410 is labeled "atdn". The high to low transition circuit 406 includes an inverter 412, a pull-up delay capacitor 414, p-channel control transistors 416, 418 and n-channel control transistors 420, 422. Inverter 412 and transistor 418 are connected to the input AIn 402 and transistors 416 and 420 are connected to the output of the inverter 412 and the pull up delay capacitor 414.

The low to high transition circuit 408 includes inverters 424, 426, pull up delay capacitor 428, p-channel control transistors 430, 432 and n-channel control transistors 434, 436. Inverter 424 and transistor 436 are connected to the input AIn, inverter 426 and transistors 422 and 432 are connected to the output of the inverter 424 and transistors 430 and 434 are connected to the output of the inverter 426 and the pull up delay capacitor 428.

When the input 402, Ain, is in a steady state high (1) logic level, transistors 416, 432, 434 and 436 will be on and transistors 418 and 430 will be off. This effectively grounds the gate, atdn, of the pull down transistor 410, keeping it turned off. When the input 402, Ain, is in a steady state low (0) logic level, transistors 418, 420, 422 and 430 are on and transistors 416, 432, 434 and 436 are off. Again, this effectively grounds the gate, atdn, of the pull down transistor

410, keeping it turned off. When the input 402, AIn transitions from a high logic level (1) to a low logic level (0), transistor 418 will immediately turn on and transistor 436 immediately turns off. Transistor 416 remains on. This happens because the rise time of the output of the inverter 412 is delayed by the pull up delay capacitor 414. This delay is caused by the added capacitance. The pull up delay capacitor 414 is preferably fabricated from a p-mos transistor whose capacitance is a direct function of the channel area. The channel area is given by the length and width of the channel as specified in the Figure. A larger area will impart a longer delay. Calculations of delay imparted on a signal by a capacitor are well known in the art. In the memory device 100, the preferred channel length to width ratio for the p-channel pull up delay capacitor is 5/2 microns.

After the delay and the output of the inverter 412 reaches a logic high level, transistor 416 will turn off. While transistors 416 and 418 are on, the gate, atdn, of the pull down transistor 410 is connected to Vcc which turns on the pull down transistor 410 and grounds the output 404. Once the output of the inverter 412 reaches a high logic level, transistor 416 will turn off and transistor 420 will turn on. This will ground the gate, atdn, of the pull down transistor 410, turning it off and returning its output to a floating state.

For transitions on the input 402 from a low logic level (0) to a high logic level (1), a similar process occurs in the low to high transition circuit 408. In this way, any transition on the input 402 will cause the output 404 to be temporarily pulled down to ground.

Figure 5:
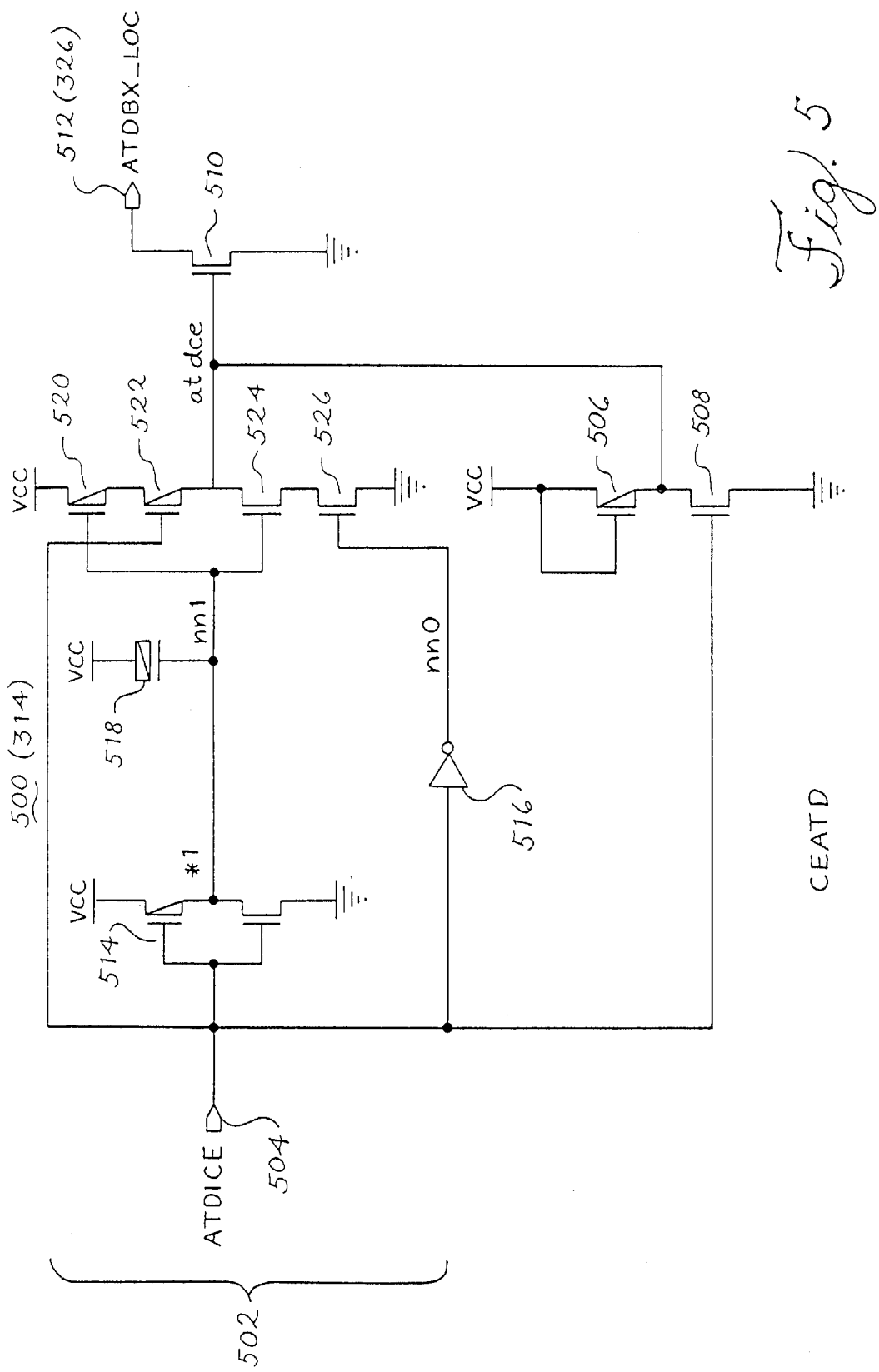
FIG. 5 depicts a schematic diagram of a CEATD circuit for use with the address transition detect signal generator of FIG. 3.

Referring now to FIG. 5, there is shown a schematic diagram of the circuit 500 used in the chip enable input transition pulse generator, CEATD 314. This circuit 500 is actually used three times, once to detect transitions of the chip enable input 103 (labeled "$\overline{CE}$" in FIG. 1) and again within the LATDBUF 318 and UATDBUF 320 which are discussed in more detail below. The chip enable input 103 to the device 100 is an active low signal which means that only a transition from a high logic level (1) to a low logic level (0) is significant. This circuit 314 is therefore designed to only detect this transition. The circuit 500 is similar to the ATDBX circuit of FIG. 4 except that it only has a high to low transition circuit 502. The circuit 500 further includes an input 504 (labeled "ATDICE"), p-channel control transistor 506, n-channel control transistor 508 and pull down transistor 510. Pull down transistor 510 is an n-channel transistor with a gate input labeled "atdce", a source input connected to ground and a drain output 512 connected to the ATDBX_bot signal path 326. The high to low transition circuit 502 includes inverters 514 and 516, pull up delay capacitor 518, p-channel control transistors 520, 522 and n-channel control transistors 524, 526. Whenever the input 504 transitions from a 1 to a 0, the transistor 508 will turn off and the high to low transition circuit 502 will temporarily connect the gate input, atdce of the pull down transistor 510 to Vcc, effectively grounding the output 512. Transistor 520 will remain on and transistor 524 will remain off until the output of the inverter 514 reaches a high logic level turning transistor 520 off and transistor 524 on. In all other situations, transistor 508 will stay on, grounding the gate input, atdce, of the pull down transistor 510, keeping it turned off. In this way, only chip enable 103 transitions from a high logic level to a low logic level will pull the output 512 low.

Figure 6:
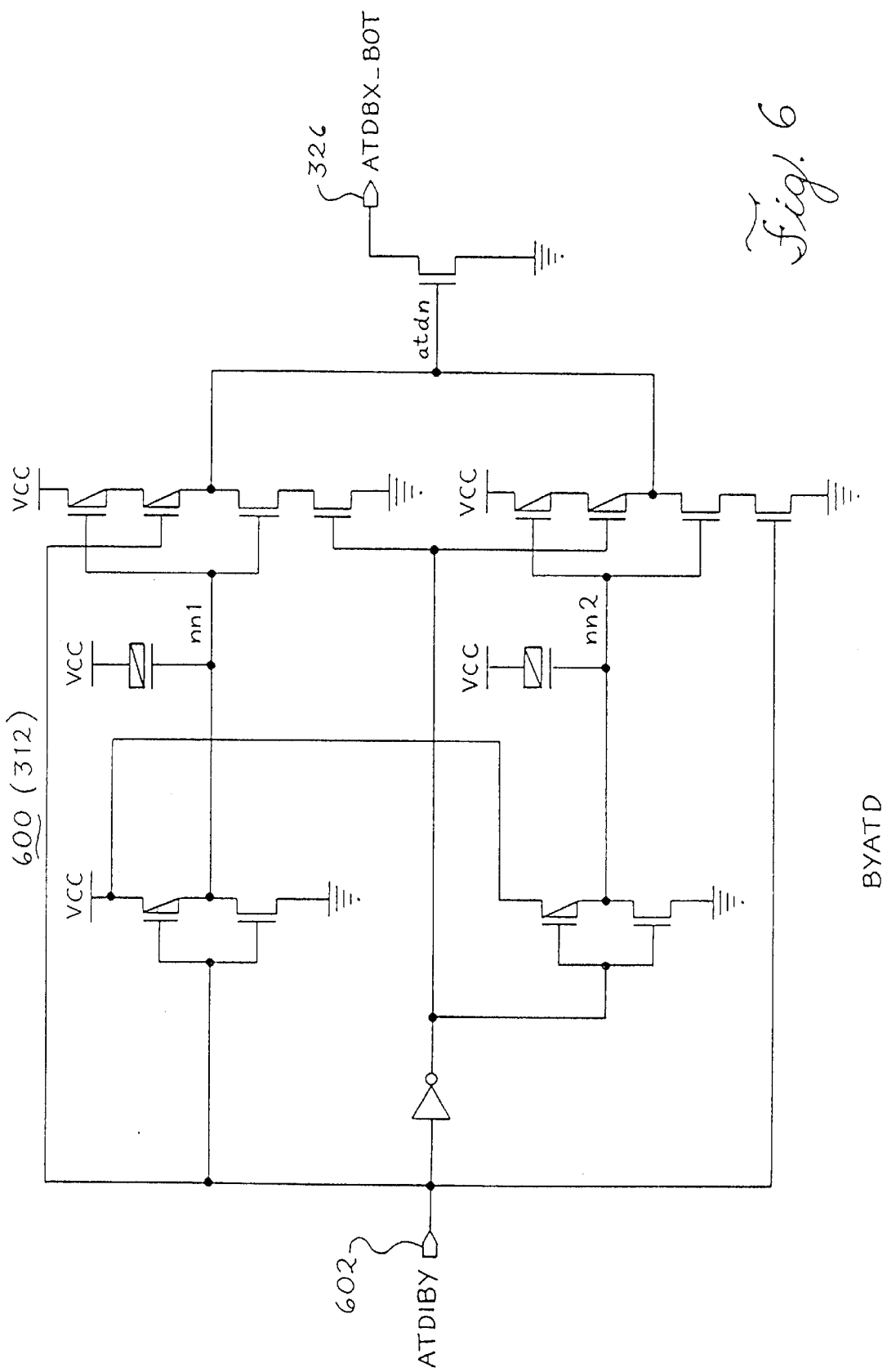
FIG. 6 depicts a schematic diagram of a BYATD circuit for use with the address transition detect signal generator of FIG. 3.

Referring now to FIGS. 6–9, there are shown schematic diagrams for the POATD 304 (FIG. 9), the EPATD 306 (FIG. 8), the ABATD 310 (FIG. 7) and the BYATD 312 (FIG. 6). Referring to FIG. 6, the BYATD 312 has the same circuit design as the ATDBX circuit. The BYATD 312 has an input 602 (labeled "ATDIBY") connected to the BYTE input 101 of the exemplary flash memory device 100. The BYTE input 101 tells the device 100 to operate in byte mode where the user can read data out of the device 100 and program the device 100 byte by byte. When this signal is unasserted, the device 100 operates in word mode where data can only be read out or programmed one word at a time. One word is equal to two bytes. When the user desires to switch from byte mode to word mode or vice versa, the BYATD 312 will detect the transition in the signal and pull the ATDBX_bot signal path 326 low.

Figure 7:
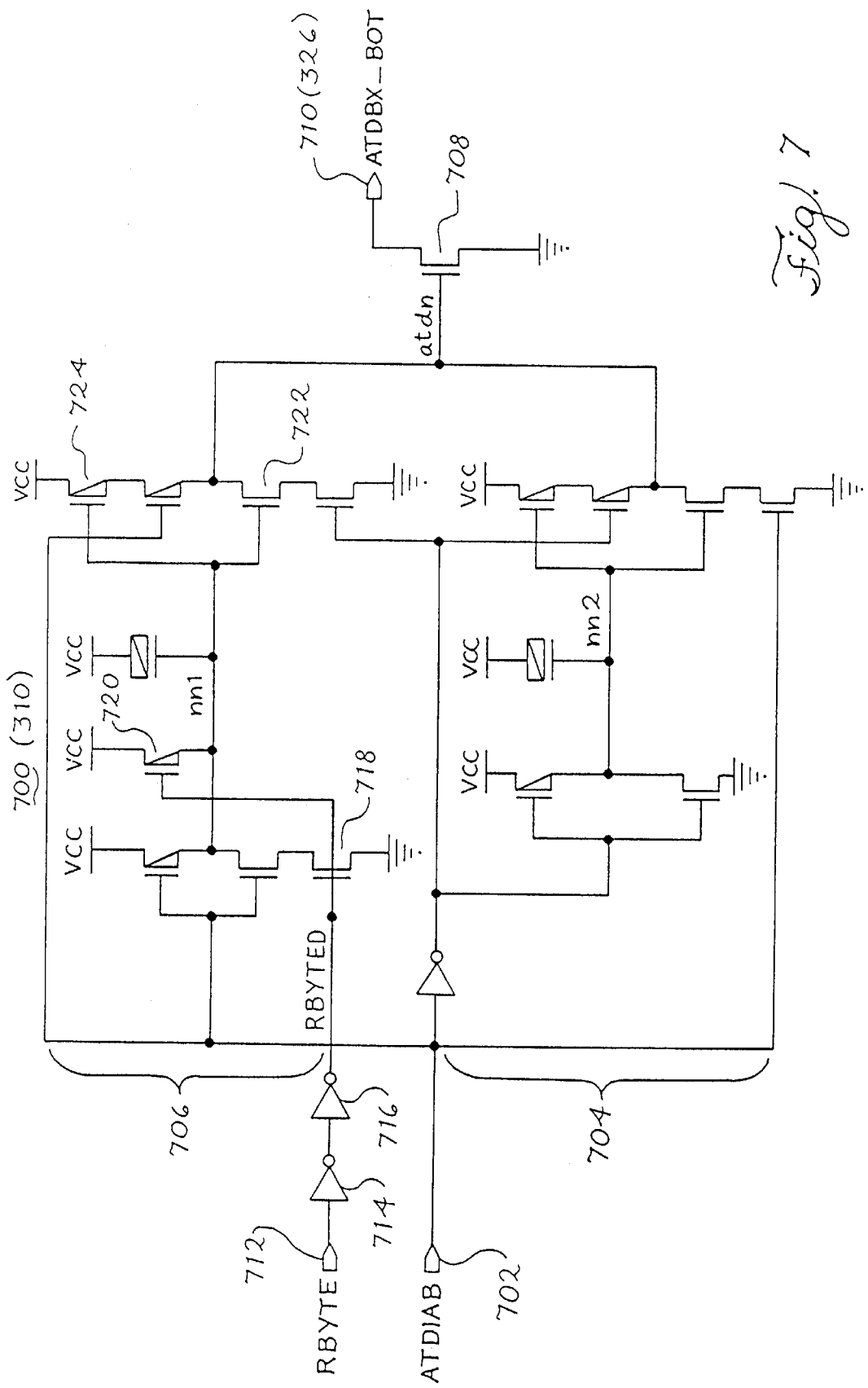
FIG. 7 depicts a schematic diagram of an ABATD circuit for use with the address transition detect signal generator of FIG. 3.

The exemplary flash memory device 100 provides 21 dedicated address bit inputs 102. The device 100 has a capacity of 32 megabits which is equivalent to 4 megabytes (222 bytes) or 2 mega-words (221 words) (1 word=2 bytes). The 21 bit address width allows 221 combinations which is enough to address 2 mega-words, however to address 4 megabytes, 22 address bits are needed. When the device 100 is in BYTE mode, the $16^{th}$ bit of the data output 192 (also known as "DQ15") is switched from an output to become an address input for the least significant bit ("LSB") of the 22 bit byte address. Referring now to FIG. 7, there is shown a ABATD circuit 310 for detecting a signal transition on this $22^{nd}$ address input. This circuit 310 operates similarly to the ATDBX circuit 400 (FIG. 4). This circuit includes an input 702 (labeled "ATDIAB") which connects to the LSB input of the device 100, low to high transition circuit 704, a high to low transition circuit 706, pull down transistor 708 and an output 710 (labeled "ATDBX_BOT") connected to the ATDBX_bot signal path 326. This circuit 700 further includes an input 712 which is labeled "RBYTE". This input 712 is necessary in case the chip enable input 103 to the device 100 transitions from high to low at the same time the BYTE mode input transitions. In this case, the CEATD circuit 314, the BYATD circuit 312 and the ABATD circuit 310 would be activated one after the other resulting in an extended ATD pulse. To prevent this, the RBYTE signal is used to kill the ATD pulse generated when the ATDIAB input 702 transitions from high to low. The RBYTE input 712 is an active low signal which connects to additional logic in the high to low transition circuit 706. This additional logic includes inverters 714 and 716, n-channel transistor 718 and p-channel transistor 720.

When the RBYTE input 712 is a 1, the two inverters 714 and 716, connected in series with the input 712 simply strengthen the signal. Transistor 718 will be on and transistor 720 will be off. Effectively, then this circuit will operate exactly like the ATDBX circuit 400, detecting both transitions from 0 to 1 and from 1 to 0 (FIG. 4 and described in detail above). If the RBYTE input 712 is a 0, then transistor 718 will be off and transistor 720 will be on. This will force on n-channel transistor 722 and force off p-channel transistor 724. When a transition on the input 702 is made from 1 to 0, the high to low transition circuit 706 is prevented from turning on transistor 724 and connecting the gate input, atdn, of the pull down transistor 708 to Vcc and turning it on. This effectively prevents the ABATD circuit 310 from generating an ATD pulse during high to low transitions. However, if the input 702 transitions from 0 to 1, then the low to high transition circuit 704 is able to pull the output 710 to ground to generate the ATD pulse.

Figure 8:
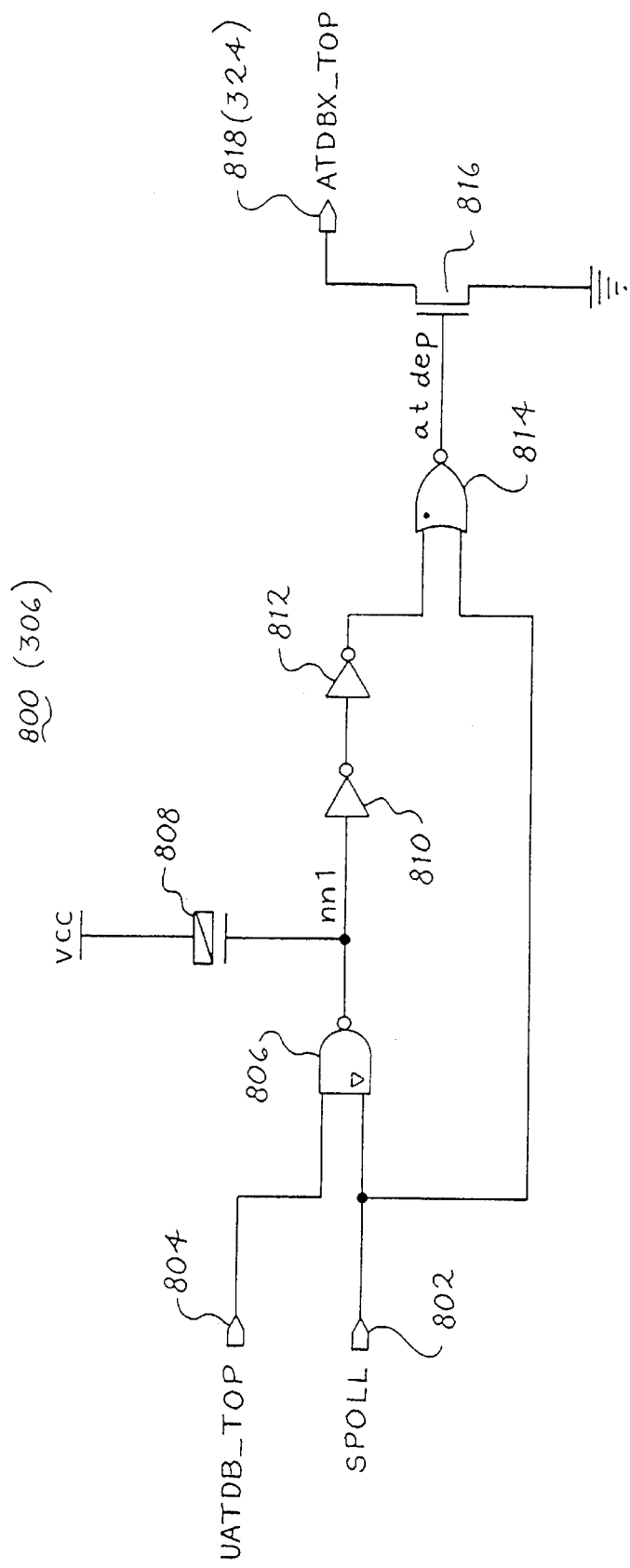
FIG. 8 depicts a schematic diagram of an EPATD circuit for use with the address transition detect signal generator of FIG. 3.

Referring now to FIG. 8, there is shown a schematic diagram of the EPATD circuit 800 of the data polling read access signal transition pulse generator 306. The EPATD circuit 800 is designed to detect when the device 100 is undergoing a data polling read access, indicated by the SPOLL signal which will be at a high logic level when the an embedded operation is underway and neither bank 194, 196 is selected for a read operation. SPOLL will drop to a low logic level if the user tries to read either bank 194, 196. During the data polling access mode of the device 100, while an embedded operation (program or erase) is taking place, the user can provide the address of the data being programmed or erased and monitor the $7^{th}$ data output pin of the device 100 for status. If an embedded erase in progress, the output pin will show a 0 and when the erase completes, it will show a 1. During an embedded program, the output pin will show the complement of the datum being programmed and once programming is complete, it will show the actual value programmed. Therefore an SPOLL high to low transition must trigger a read operation sequence to load valid data from the array into the read sense amplifier output latches upon completion of the embedded operation. Note that if a read operation sequence has already been initiated and the SPOLL signal transitions from 1 to 0, this circuit will not generate another ATD pulse.

The EPATD circuit 800 includes an input 802 for the SPOLL signal and an input 804 for the UATDB_top signal from the LATDB output of the LATDBUF 318 (this circuit is discussed in more detail below). Inputs 802 and 804 connect to NAND gate 806. The NAND gate 806 is connected to a p-channel pull up delay capacitor 808 and series connected inverters 810 and 812. The output of the last inverter in the series, 812 is connected to NOR gate 814. The second input of the NOR gate 814 is also connected to the SPOLL input 802. The output of the NOR gate 814 is connected to the gate (labeled "atdep") of the n-channel pull down transistor 816. The output of the pull down transistor 816 is connected to the output 818 which connects to the ATDBX_top signal path 324.

As will be discussed below, the steady state value of the UATDB top signal input 804 is 1 and will be 0 during the generation of an ATD pulse. The steady state of the SPOLL signal input 802 is 0 indicating no embedded operation underway or one is underway but a data polling access is also underway. In this state, the output of the NAND gate 806 will be a 1 resulting in a 1 on the input of the NOR gate 814. The output of the NOR gate 814 will therefore be 0. When the SPOLL signal input 802 transitions from 0 to 1, the output of the NAND gate 806 will drop to 0 but the NOR gate 814 output will remain 0. When the SPOLL signal input 802 then transitions back to 0, the output of the NAND gate 806 will remain at 0 for a short duration due to the delay imparted on the output by the pull up delay capacitor 808. The SPOLL input to the NOR gate 814 will instantly change to 0. This results in an output of 1 from the NOR gate 814 which turns on pull down transistor 816, grounding the output 818. Once the output of the NAND gate 806 is pulled up to a 1, the NOR gate 814 output will switch back to 0 and the pull down transistor 816 will turn off again. Note that if the UATDB_top signal input 804 is 0 indicating an ATD pulse is already being generated, the NAND gate 806 output will slowly switch to a 1, however unless the SPOLL input 802 switches to 0 at the same time, the NOR gate 814 output will remain off, effectively blocking any 1 to 0 transition of the SPOLL input 802 from triggering an ATD pulse. This prevents the SPOLL input 802 from interfering with an already occurring ATD pulse.

Figure 9:
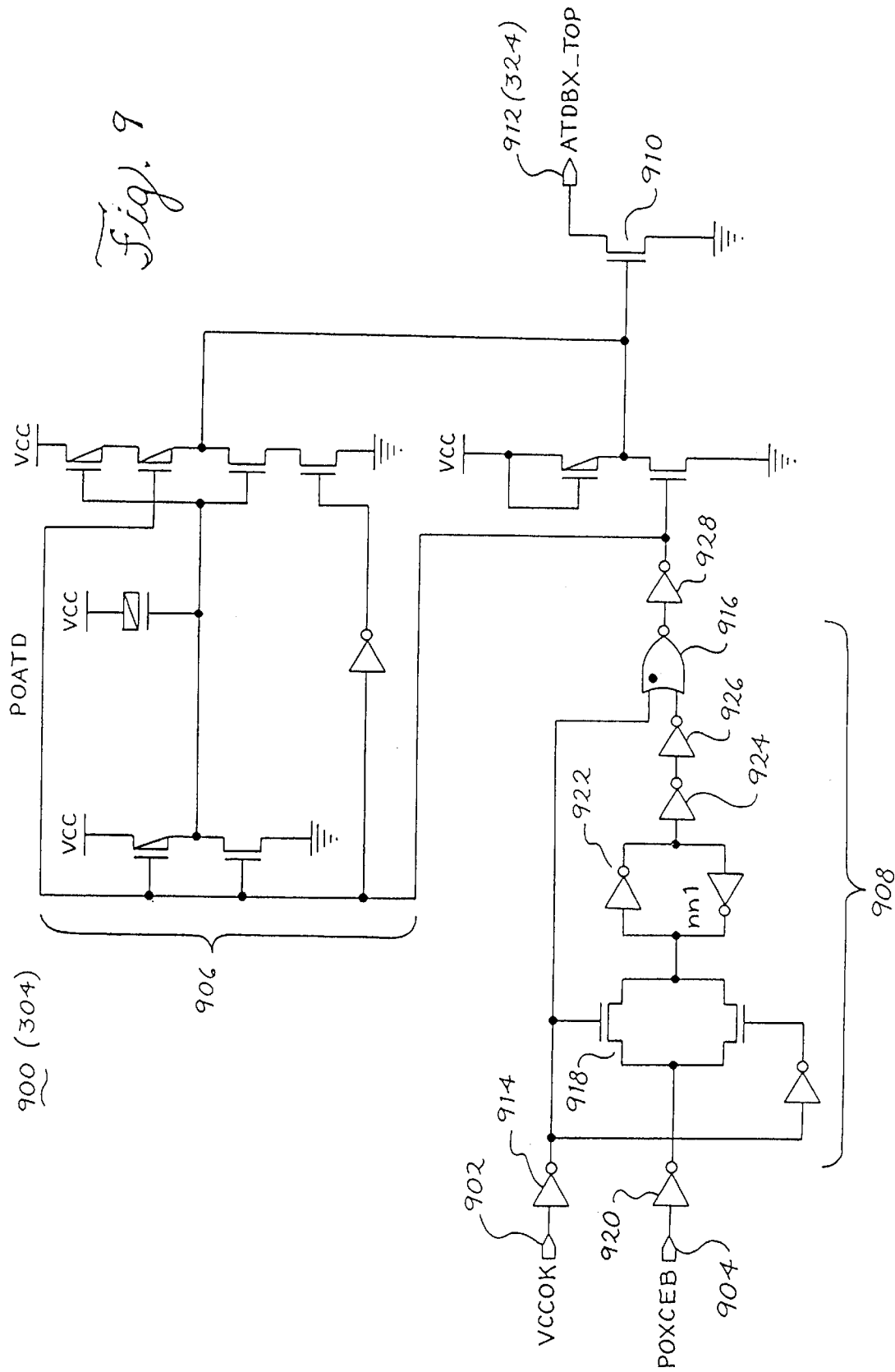
FIG. 9 depicts a schematic diagram of a POATD circuit for use with the address transition detect signal generator of FIG. 3.

Referring now to FIG. 9, there is shown a schematic diagram of a POATD circuit 900 for a power input signal transition pulse generator 304. The circuit 900 includes an input 902 for a power on signal, labeled "VCCOK", and an input 904 for a power on test mode indicator, labeled "POXCEB". The circuit 900 further includes a pulse generator circuit 906, a latch circuit 908, an n-channel pull down transistor 910 and an output 912 connected to the ATDBX_ top signal path 324. This circuit 900 is designed to detect power on of the device 100 and cause a read path operation sequence to begin so that the user does not have to transition the address inputs 102 of the device to read the first address. With this scheme, the device will read out the data of the address on the inputs 102 as of power on. However, if the power on signal comes during the column pre-test mode of the device 100, an ATD pulse should not be generated.

The input 902 VCCOK is the power on signal which will transition from 0 to 1 upon power on. This signal is inverted by inverter 914 and then connected to NOR gate 916. The latch circuit 908 includes inverter 920, transmission gate 918, latch 922 and series inverters 924 and 926. The input 902 is also connected to the transmission gate 918. A transmission gate or pass gate is built from back to back n-channel and p-channel transistors. The n-channel transistor is connected to a control signal and the p-channel transistor is connected to the inverted control signal. When the control signal is asserted, the transmission gate will pass its input to the output. This device takes advantage of the fact that n-channel transistors pass good high logic values but not good low logic values and p-channel transistors pass good low logic values but not good high logic values. In the circuit 900, the control signal for the transmission gate is the output of the inverter 914. The input of the transmission gate 918 is the POXCEB input 904 which indicates when the device 100 is in column pretest mode. The output of the transmission gate connects to the latch 922. The latch 922 output is connected to the first inverter 924 which connects to the second inverter 926 and then to the second input of the NOR gate 916.

The output of the NOR gate 916 connects to an inverter 928 and then to the pulse generator circuit 906. The pulse generator circuit 906 will turn on the pull down transistor 910 for a short duration of time when the output of the NOR gate 916 changes 0 to 1. The pulse generator circuit 906 is similar to the CEATD circuit 500 (FIG. 5), described in more detail above. However, in the pulse generator circuit 906, the pull up delay capacitor 930 has a larger area as determined by its channel length and width which results in a longer rise time and ultimately a longer ATD pulse. In the preferred POATD circuit 900, the pull up delay capacitor 930 has a channel length to width ration of 7/8 although other values may work as well.

If the device 100 is not in a pre-test state, the POXCEB input 904 will be 0. If the VCCOK input is 0, then the transmission gate 918 will pass the output of inverter 920 to the latch 922 which will in turn pass the signal to the inverters 924 and 926 putting a 0 on the input to the NOR gate 916. When the VCCOK signal changes from 0 to 1, the transmission gate 918 will turn off, causing the latch 922 to latch the 0 value of the POXCEB input 904 input and hold a 0 value on the input of the NOR gate 916 even if the POXCEB input 904 subsequently changes. The transition from 0 to 1 of the VCCOK input will cause the other input of the NOR gate 916 (which is connected to inverter 914) to transition from 1 to 0. This will cause the output of the NOR gate 916 to switch from 0 to 1 which cause the output of the inverter 928 to switch from 1 to 0 triggering the pulse generator 906 to turn on pull down transistor 910.

If the device 100 is in a pre-test state, the POXCEB input 904 will be 1. This 1 will be passed by the latch circuit 908 to the input of the NOR gate 916. If the VCCOK signal then transitions from 0 to 1, the transmission gate 918 will turn off, causing the latch to hold the 1 value of the POXCEB input 904 on the input of the NOR gate 916 which will prevent it from switching and causing the pulse generator 906 to turn on the pull down transistor 910. Therefore, even if the POXCEB input 904 subsequently drops to 0, an ATD pulse will not be generated.

Referring now to FIG. 10, there is shown a schematic diagram of a preferred ATDBX_DMY circuit 1000 for use in the pulse signal loading equalization circuit 316 along with an exemplary physical layout of the circuit 1000. As was described above, the outputs of the LATDBX 302, the POATD 304 and the EPATD 306 are all connected in a wired-or configuration to the ATDBX_top signal path 324. In reality, it is the outputs of the pull down transistors of each circuit which are connected. For the ATDBX_top signal path 324, there are 21 pull down transistors. The outputs of the UATDBX 308, the ABATD 310, the BYATD 312 and CEATD 314 are all similarly connected in a wired-or configuration to the ATDBX_bot signal path 326. However, these circuits only include 8 pull down transistors. This results in unequal loading of the ATDBX_top signal path 324 with 21 pull down transistors and the ATDBX_bot signal path 326 with only 8 pull down transistors. This unequal loading will affect the ATD pulse signal timing because, as will be discussed below, these signal paths 324, 326 initiate the ATD pulse. Therefore, the pulse signal loading equalization circuit 316 is used to connect to the ATDBX_bot signal path 326 and equalize the loading. The pulse signal loading equalization circuit 316 includes a circuit 1000 labeled "ATDBX_DMY" which is the equivalent of 13 pull down transistors. The circuit 1000 includes n-mos transistors 1002, 1004 and 1006 connected in series with the output 1008 which connects to the ATDBX_bot signal path 326. The large channel width to length ratios makes these three transistors appear as 13 turned off pull down transistors to the overall circuit. In the memory device 100, the preferred transistor channel length to width ratios are 55/.05, 50/.05 and 50/.05 microns however, circuit configurations which match the pull down loading of the ATDBX_top 324 and ATDBX_bot 326 signal paths are contemplated.

Referring now to FIG. 11, there is shown a preferred ATDBUF circuit 1100 for use in the LATDBUF 318 and the UATDBUF 320. The circuit 1100 includes an input 1102, labeled ATDBX_loc, which connects to the ATDBX_bot signal for the UATDBUF 318 and to the ATDBX_top signal for the LATDBUF 320. The circuit 1100 further includes a UATDB_loc input 1104, a LATDB_loc input 1106, a qATDB output 1108 and a qATD output 1110. In addition, the circuit 1100 includes a diode/resistive pull up network 1112, inverters 1114 and 1116, NAND gate 1118, inverter 1120 and delay circuit 1122. The diode/resistive pull up network 1112 is connected to the input 1102 and pulls the ATDBX top 324 and ATDBX_bot 326 signal paths high after they have been pulled low by the pull down transistors in the pulse generators 302, 304, 306, 308, 310, 312 and 314. As described above, the pulse generators 302, 304, 306, 308, 310, 312 and 314 will turn on their pull down transistors when they detect their particular signal transition. The pull down transistor will then connect the ATDBX top 324 or the ATDBX_bot 326 signal paths to ground as the case may be. This will pull the signal path low. When the pulse generator turns off the pull down transistor (as described above), the signal paths 324 and 326 will be left to float and the diode/resistive pull up network 1112 will pull the signal path back to a high logic level. The circuit 1112 includes a network of diodes and resistors as well as a p-channel transistor to provide a delayed signal pull up. This circuit 1112 is further designed to handle different device 100 operating voltages and also either a uniform sector configured device 100 or a bootblock configured device 100. The diode/resistive pull up network provides metal2 option circuits which allow the various options to be changed by only changing the metal2 layer in the fabrication process. This makes design of the device and implementation of changes much easier.

The input 1102 of the circuit 1100 is also connected to the input of inverter 1114 which is subsequently connected to the inverter 1116 which is connected to the qATDB output 1108. Effectively, the inverters 1114 and 1116 boost the input 1102 signal strength and pass it to the qATDB output 1108. NAND gate 1118 is connected to the UATDB_loc input 1104 and the LATDB_loc input 1106. This NAND gate 1118 generates the ATD pulse output signal on the qATD output 1110 whenever either input 1104 or 1106 is a low value. The output of the NAND gate 1118 is also connected to inverter 1120 which connects to the delay circuit 1122. The delay circuit 1122 is preferably a CEATD circuit 500 (See FIG. 5) which is designed to pull its output low for a short duration when the input transitions from 1 to 0. This circuit is used to control the duration of the ATD pulse (as described below) by adding a rise time delay to this signal path. The output of the delay circuit 1122 connects to the input of inverter 1114 setting up a feed back path 1124.

Referring back to FIG. 3, the ATD_BRIDGE circuit contains the signal paths which interconnect the UATDB_loc inputs 1104, the LATDB_loc inputs 1106 and the qATDB outputs 1108 of the LATDBUF 318 and the UATDBUF 320. The LATDBUF 318 drives the ATD pulse signal for bank 194 of the memory array and the UATDBUF 320 drives the ATD pulse signal for bank 196. Therefore, the LATDBUF 318 is physically located at the top of the device 100 near the location of bank 194. The UATDBUF 320 is physically located at the bottom of the device 100 near the location of bank 196. The design of the ATDBUF circuit 1100 in conjunction with the ATD_BRIDGE circuit 322 equalizes the ATD signal pulse lengths between the LATDBUF 318 and the UATDBUF 320, compensating for the physical distance between them as well as the uneven parasitic loading due to the unequal bank partition sizes.

The ATD_BRIDGE circuit 322 contains signal routing between the LATDBUF 318 and the UATDBUF 320. These signal paths are fabricated from a combined metal 1 and metal 2 layering which increases the signal speed. The qATDB output 1108 of the LATDBUF 318 is routed to a center point 340 over signal path 342 labeled "LATDB". From the center point 340, the LATDB signal 342 is distributed over equidistant signal paths 344 and 346 labeled "LATDB_top" and "LATDB_bot". The LATDB_top signal path 344 goes to the LATDB_loc input 1106 of the LATDBUF 318 which connects with NAND gate 1118 in the ATDBUF circuit 1100. The LATDB_bot signal path 344 goes to the LATDB_loc input of the UATDBUF 320 as well. Similarly, the qATDB output 1108 of the UATDBUF 320 is routed to a center point 348 over signal path 350 labeled "UATDB". From the center point 348, the UATDB signal is distributed over equidistant signal paths 352 and 354, labeled "UATDB_top" and "UATDB_bot". The UATDB_top signal 352 is connected to the UATDB_loc input 1104 of the LATDBUF 318 and the UATDB bot signal 354 signal is connected to the UATDB_loc input 1104 of the UATDBUF 320.

Referring back to FIG. 11, it can be seen that the qATDB output 1108 is connected to one of the inputs 1104, 1106 of same ATDBUF circuit 1100 and also to one of the inputs 1104, 1106 of the other ATDBUF circuit 100 which interconnects the LATDBUF 318 and UATDBUF 320. In the steady state where no ATD pulse is being generated, the inputs 1102 to the ATDBUF circuits 1100 of the LATDBUF 318 and UATDBUF 320 will be 1 due to the diode/resistive pull up network 1112. This signal will pass through the inverters 1114 and 1116 and to output 1108. The signals will go out over the signal paths 342, 344, 346, 350, 352, 354 of the ATD_BRIDGE circuit 322 resulting in a 1 on each input 1104, 1106 of the ATDBUF circuits 1100. This will result in a 0 on the output qATD 1110 as well as a 1 on the input to the delay circuit 1122 of each ATDBUF 1100 (see FIG. 5, the pull down transistor of the delay circuit 1122 will be off).

When a signal transition occurs on the one of the signal inputs to the ATD signal generator 300, one of the pulse generators will connect their pull down transistor to ground pulling down either the ATDBX_top signal path 324 or the ATDBX_bot signal path 326. Effectively, putting zero on the input 1102 of the corresponding ATDBUF circuits 318 or 320. After a short duration, the pull down transistor will turn off and the signal path 324 or 326 will float. At this point, the diode/resistive pull up network 1112 in the particular ATDBUF 1100 (either the LATDBUF 318 or the UATDBUF 320) will pull the signal high again.

While the input 1102 to the particular ATDBUF circuit 1100 is low, that 0 value is passed through inverters 1114 and 1116 and to the output qATDB 1108. It is then routed through the ATD_BRIDGE and back into both the LATDBUF 318 and the UATDBUF 320 simultaneously due to the equidistant signal paths 342, 344, 346, 350, 352, 354. This causes the NAND gates 1118 in both the LATDBUF 318 and the UATDBUF 320 to switch their outputs to 0 simultaneously generating simultaneous ATD signals from the output qATD 1110 of the LATDBUF 318 and the UATDBUF 320. Further, the output of the NAND gates 1118 also goes to the delay circuit 1122 and the feed back path 1124. The transition of the NAND gate 1118 output from 0 to 1 causes a transition of 1 to 0 on the input of the delay circuit 1122 which pulls the feedback path 1124 down to ground and propagates the ATD signal through the ATDBUF circuits again. Once the input 1102 of the ATDBUF circuit 1100 is left to float by both the particular signal generator which detected the signal transition in the first place and the delay circuit 1122, the diode/resistive pull up network 1112 will pull the input 1102 back up to a 1 which will propagate through the LATDBUF 318 and the UATDBUF 320 resulting in the NAND gate 1118 output returning to zero and ending the ATD signal.

Figure 12A:
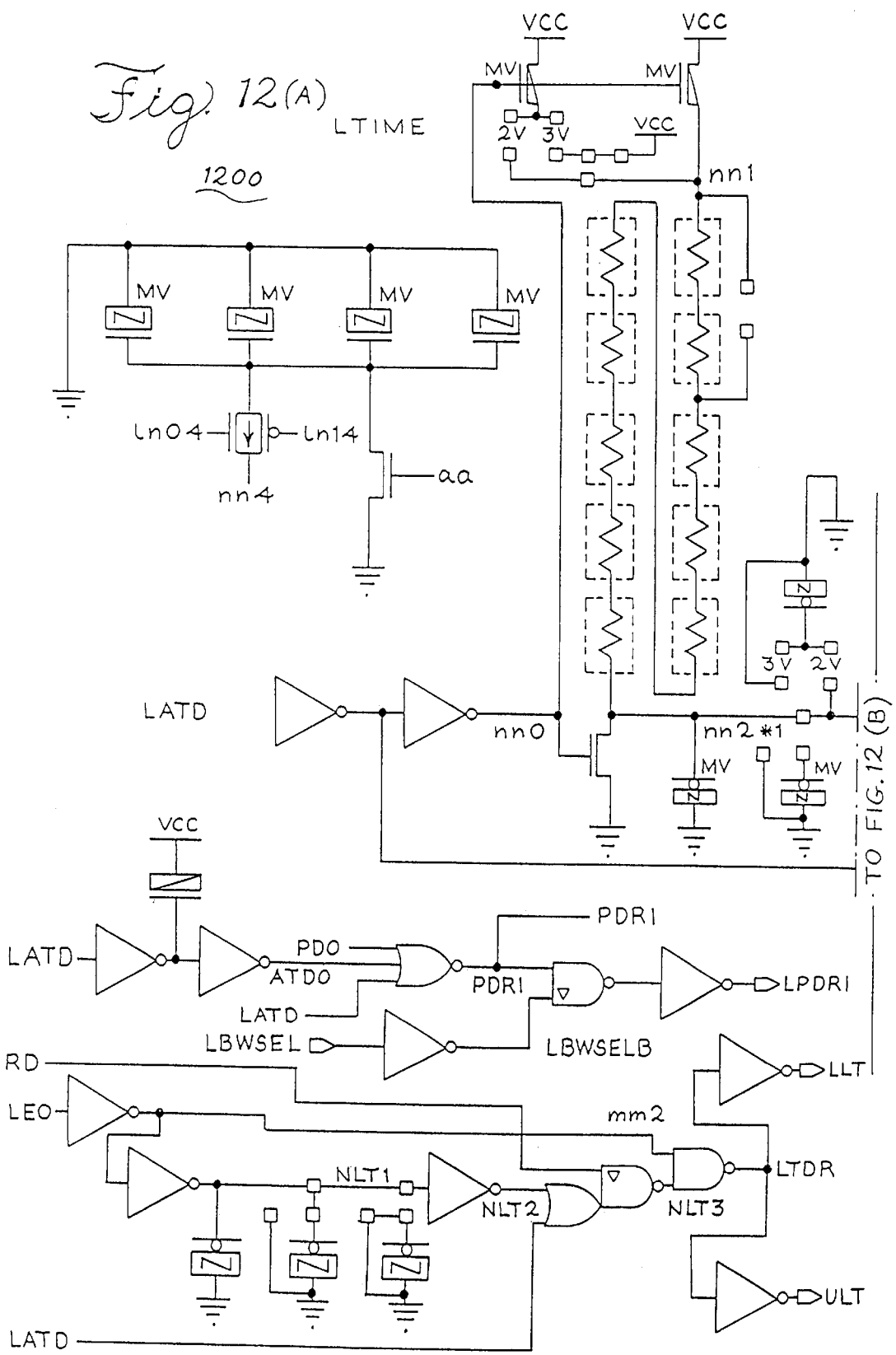
FIG. 12 depicts a schematic diagram of an LTIME circuit for use with the address transition detect signal generator of FIG. 3.
Figure 12B:
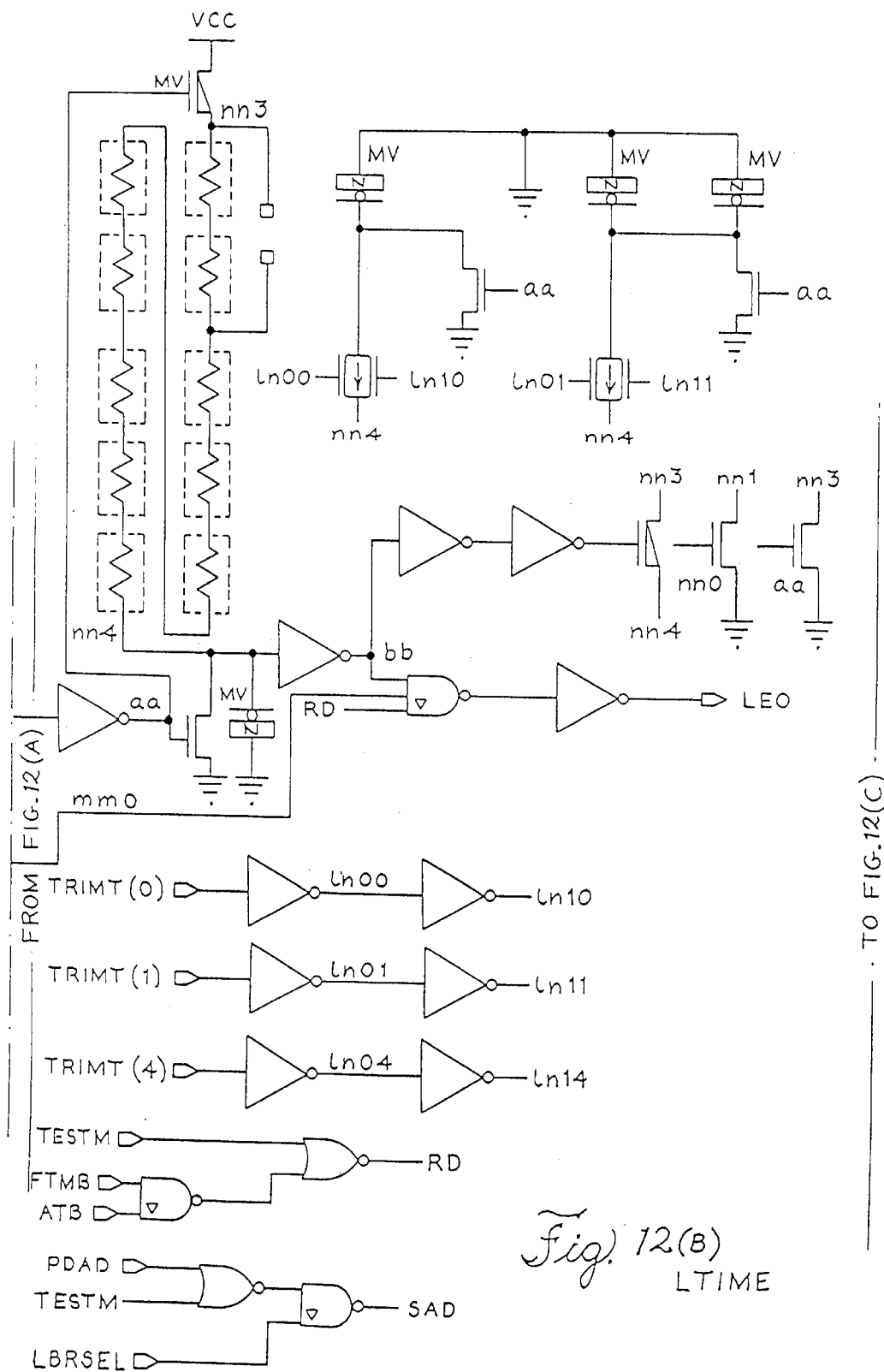
Figure 13B:
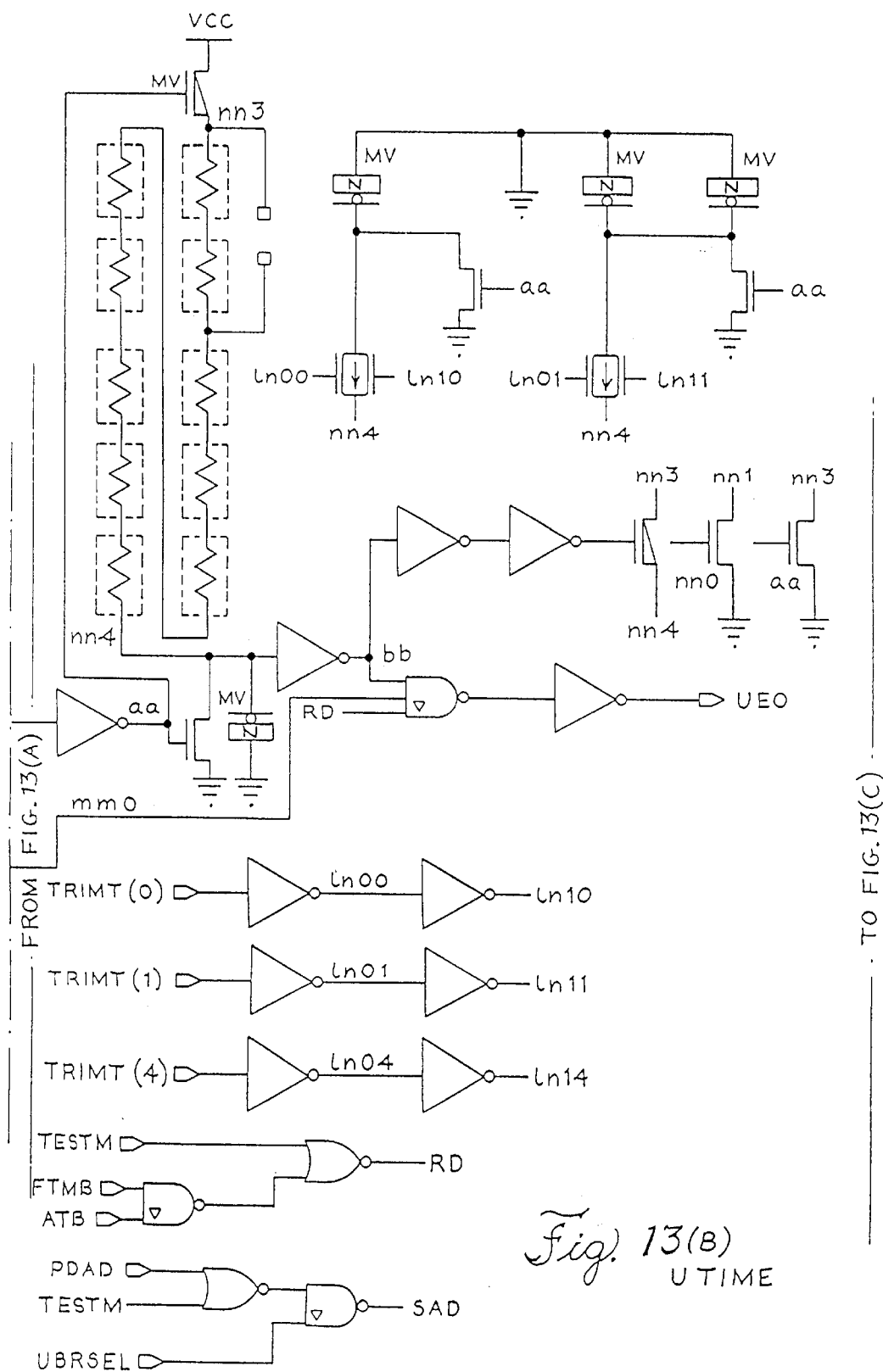
FIG. 13 depicts a schematic diagram of a UTIME circuit for use with the address transition detect signal generator of FIG. 3.

FIGS. 12 and 13 depict the LTIME 1200 and UTIME 1300 circuits which utilize the ATD signal from the LATDBUF 318 and the UATDBUF 320 to generate other timing signals such as the equalization signal 208.

It is to be noted that suitable transistor sizes specifying channel width to length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It is therefore intended that the foregoing detailed description be regarded as illustrative rather than limiting, and that it be understood that it is the following claims, including all equivalents, that are intended to define the spirit and scope of this invention.

We claim:

1. An address transition detector for a dual bank flash memory device comprising:

a first detector operative to generate a first detection signal when a first signal transitions;

a first receiver coupled with said first detector and operative to receive said first detection signal;

first and second signal paths coupled with said first receiver operative to transmit said first detection signal, said first and second signal paths characterized by equivalent delay;

a first generator coupled with said first signal path and operative to generate a first transition signal upon receipt of said first detection signal;

a second generator coupled with said second signal path and operative to receive said first detection signal and generate a second transition signal; and wherein said first and second transition signals are generated substantially simultaneously.

2. The address transition detector of claim 1 further comprising:

a second detector operative to generate a second detection signal when a second signal transitions;

a second receiver coupled with said second detector and operative to receive said second detection signal;

third and fourth signal paths coupled with said second receiver operative to transmit said second detection signal, said third and fourth signal paths characterized by equivalent delay;

said first generator being further coupled with said third signal path and 10 further operative to generate said first transition signal upon receipt of said second detection signal; and said second generator being further coupled with said fourth signal path and further operative to generate said second transition signal upon receipt of said second detection signal.

3. The address transition detector of claim 1, wherein said first and second signal paths are further characterized by a resistance and a capacitance and further wherein said delay is a function of said resistance and capacitance.

4. The address transition detector of claim 1, wherein said first and second signal paths are further characterized by a length and further wherein said delay is a function of said length.

5. A method of synchronizing generation of first and second output signals in a dual bank flash memory device comprising:

generating a detection signal in response to an in input signal transition;

transmitting said detection signal over first and second signal paths, said first and second signal paths characterized by an equivalent delay;

generating said first output signal upon receipt of said detection signal over said first signal path; and generating substantially simultaneously said second output signal upon receipt of said detection signal over said second signal path.

6. The method of claim 5, wherein said first and second signal paths are further characterized by a resistance and a capacitance and further wherein said delay is a function of said resistance and capacitance.

7. The method of claim 5, wherein said first and second signal paths are further characterized by a length and further wherein said delay is a function of said length.

* * * * *